(12) United States Patent
Takahashi et al.

(10) Patent No.: US 10,784,368 B2
(45) Date of Patent: Sep. 22, 2020

(54) SEMICONDUCTOR DEVICE

(71) Applicant: FUJITSU LIMITED, Kawasaki-shi, Kanagawa (JP)

(72) Inventors: Tsuyoshi Takahashi, Ebina (JP); Kenichi Kawaguchi, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/263,515

(22) Filed: Jan. 31, 2019

(65) Prior Publication Data

US 2019/0267484 A1 Aug. 29, 2019

(30) Foreign Application Priority Data

Feb. 23, 2018 (JP) ................................. 2018-031223

(51) Int. Cl.
| | |
|---|---|
| H01L 29/66 | (2006.01) |
| H01L 29/778 | (2006.01) |
| H01L 29/06 | (2006.01) |
| H01L 29/423 | (2006.01) |
| H01L 29/417 | (2006.01) |
| H01L 29/205 | (2006.01) |

(52) U.S. Cl.
CPC ...... H01L 29/7788 (2013.01); H01L 29/0676 (2013.01); H01L 29/205 (2013.01); H01L 29/41741 (2013.01); H01L 29/42316 (2013.01); H01L 29/66462 (2013.01); H01L 29/7787 (2013.01); H01L 29/7789 (2013.01)

(58) Field of Classification Search
CPC ............. H01L 29/7788; H01L 29/7789; H01L 29/66462; H01L 29/0676; H01L 29/42316; H01L 29/7787; H01L 29/41741; H01L 29/20

USPC ......................................................... 257/194
See application file for complete search history.

(56) References Cited

U.S. PATENT DOCUMENTS 9,318,583 B2 * 4/2016 Verhulst ............ H01L 29/66666
10,014,372 B1 * 7/2018 Leobandung ....... H01L 29/1037
(Continued)

FOREIGN PATENT DOCUMENTS

| JP | 2010-503981 | 2/2010 |
| JP | 2011-238909 | 11/2011 |

OTHER PUBLICATIONS

Sofia Johansson et al., "High-Frequency Gate-All-Around Vertical InAs Nanowire MOSFETs on Si Substrates", IEEE Electron Device Letters, vol. 35, No. 5, pp. 518-520, May 2014 (3 pages).

*Primary Examiner* — Vu A Vu
(74) *Attorney, Agent, or Firm* — Fujitsu Patent Center

(57) ABSTRACT

A semiconductor device includes a semiconductor substrate composed of a compound semiconductor, a first semiconductor region disposed over a surface of the semiconductor substrate so as to extend upward from the surface of the semiconductor substrate, the first semiconductor region including a semiconductor nanowire composed of a compound semiconductor, a second semiconductor region disposed over the periphery of a side surface of the first semiconductor region, a gate electrode disposed over the periphery of the second semiconductor region, a drain electrode coupled to one end of the first semiconductor region, and a source electrode coupled to another end of the first semiconductor region, the first and second semiconductor regions being composed of different semiconductor materials.

14 Claims, 34 Drawing Sheets

(56) References Cited

U.S. PATENT DOCUMENTS

2010/0176459 A1 7/2010 Wernersson et al.
2011/0253981 A1 10/2011 Rooyackers et al.

\* cited by examiner

SEMICONDUCTOR DEVICE

CROSS-REFERENCE TO RELATED APPLICATION

This application is based upon and claims the benefit of priority of the prior Japanese Patent Application No. 2018-31223, filed on Feb. 23, 2018, the entire contents of which are incorporated herein by reference.

FIELD

The embodiments discussed herein are related to a semiconductor device and a method for manufacturing the semiconductor device.

BACKGROUND

High-electron mobility transistors (HEMTs), which are field effect transistors (FETs) commonly used for radio communication, include a substrate, a film-like electron transit layer, and a film-like electron supply layer that are stacked on top of one another. There have been disclosed nanowire metal oxide semiconductor field effect transistors (MOSFETs) that include semiconductor nanowires and have a structure that enables size reduction and high-speed operation. The nanowire MOSFETs enable suitable pinch-off characteristic of channel and enhances the properties of semiconductor devices.

There has been a demand for a semiconductor device that includes semiconductor nanowires which is capable of operating at a further high speed and have a suitable high-frequency characteristic.

The followings are reference documents.
[Document 1] Japanese National Publication of International Patent Application No. 2010-503981,
[Document 2] Japanese Laid-open Patent Publication No. 2011-238909, and
[Document 3] Sofia Johansson, Elvedin Memisevic, Lars-Erik Wernersson, and Erik Lind, "High-Frequency Gate-All-Around Vertical InAs Nanowire MOSFETs on Si substrates", *IEEE ELECTRON DEVICE LETTERS*, Vol. 35, No. 5, May 2014.

SUMMARY

According to an aspect of the embodiments, a semiconductor device includes a semiconductor substrate composed of a compound semiconductor, a first semiconductor region disposed over a surface of the semiconductor substrate so as to extend upward from the surface of the semiconductor substrate, the first semiconductor region including a semiconductor nanowire composed of a compound semiconductor, a second semiconductor region disposed over the periphery of a side surface of the first semiconductor region, a gate electrode disposed over the periphery of the second semiconductor region, a drain electrode coupled to one end of the first semiconductor region, and a source electrode coupled to another end of the first semiconductor region, the first and second semiconductor regions being composed of different semiconductor materials.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
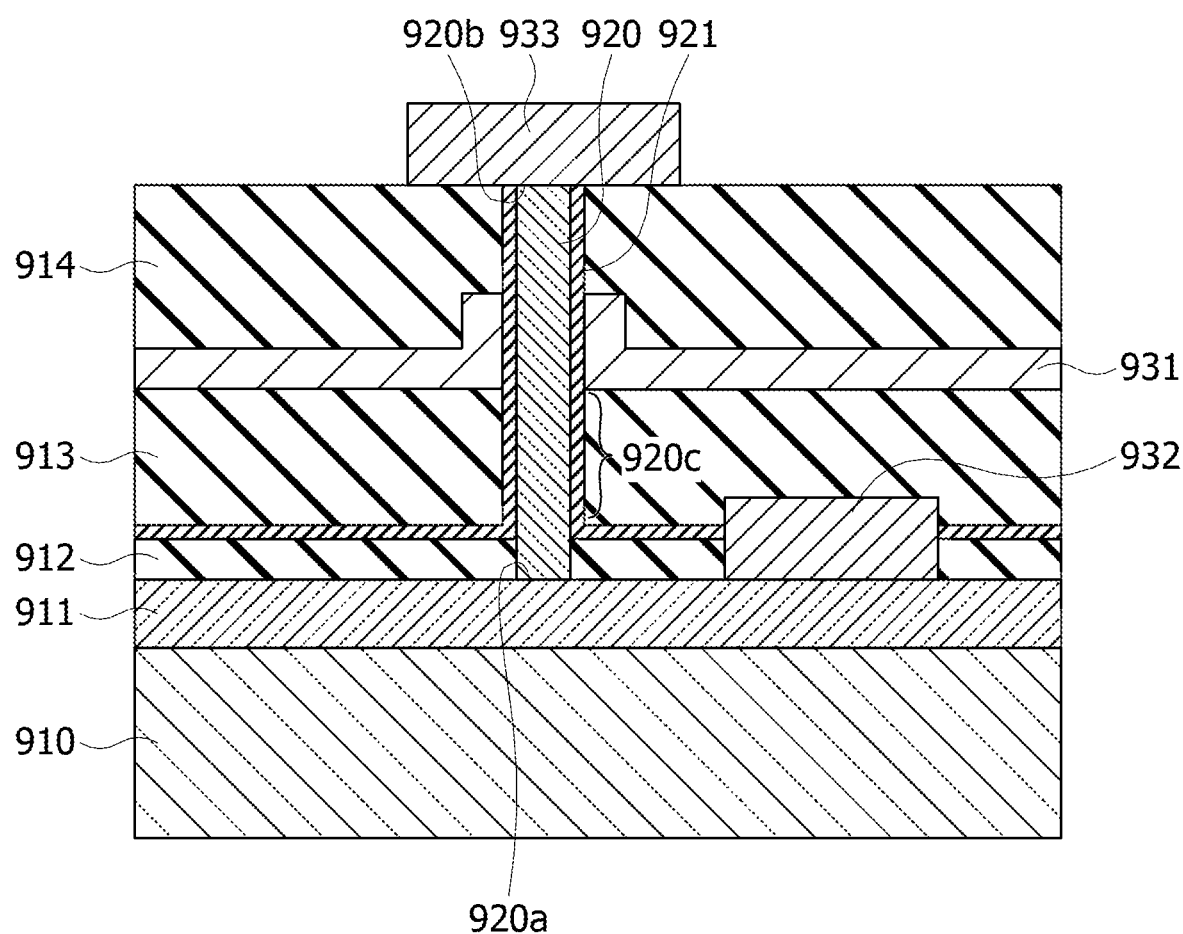
FIG. 1 is a diagram illustrating a semiconductor device that includes a semiconductor nanowire.

Embodiments of the present disclosure are described below. Hereinafter, the same elements and the like are denoted by the same reference numeral, and the description thereof is omitted.

First Embodiment

Figure 2:
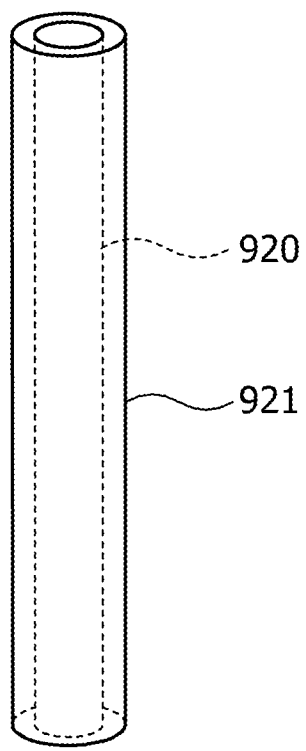
FIG. 2 is a diagram for explaining a semiconductor device that includes a semiconductor nanowire.

A MOSFET that includes a semiconductor nanowire is described below with reference to FIG. 1. The MOSFET including a semiconductor nanowire which is illustrated in FIG. 1 includes a semiconductor substrate 910, a conductive semiconductor layer 911 disposed on the semiconductor substrate 910, and a semiconductor nanowire 920 disposed on the conductive semiconductor layer 911 which extends substantially perpendicular to the surface of the conductive semiconductor layer 911. As illustrated in FIG. 2, the semiconductor nanowire 920 is provided with an insulating film 921 that is composed of a low-k material and disposed on the periphery of the side surface of the semiconductor nanowire 920 so as to cover the side surface of the semiconductor nanowire 920. On a portion of the surface of the conductive semiconductor layer 911 which is other than the portion of the surface of the conductive semiconductor layer 911 on which the semiconductor nanowire 920 is disposed, an insulating film 912, an insulating film 921, an interlayer insulating film 913, a gate electrode 931, and an interlayer insulating film 914 are stacked on top of one another. An end 920a of the semiconductor nanowire 920 which faces the semiconductor substrate 910 is electrically connected to the conductive semiconductor layer 911. A source electrode 932 is disposed on the conductive semiconductor layer 911. A drain electrode 933 is disposed on the other end 920b of the semiconductor nanowire 920.

In the MOSFET including a semiconductor nanowire which is illustrated in FIG. 1, the amount of current that flows between the source electrode 932 and the drain electrode 933 may be controlled by applying a voltage to the gate electrode 931. In the MOSFET including a semiconductor nanowire which is illustrated in FIG. 1, a portion 920c of the semiconductor nanowire 920 which extends from the portion of the semiconductor nanowire 920 which is adjacent to the gate electrode 931 to the portion of the semiconductor nanowire 920 which is in contact with the conductive semiconductor layer 911 has a high electric resistance, that is, a high source resistance, which has limited an increase in the speed of operation of the MOSFET. In other words, it has been not possible to achieve a suitable high-frequency characteristic.

Therefore, there has been a demand for a semiconductor device that includes a semiconductor nanowire and has a suitable high-frequency characteristic.

Semiconductor Device

A semiconductor device according to a first embodiment is described below. The semiconductor device according to this embodiment is a HEMT semiconductor device that includes a semiconductor nanowire. Using a semiconductor device having a HEMT structure enables a semiconductor device that includes a semiconductor nanowire to operate at a high speed and have a suitable high-frequency characteristic.

Figure 3:
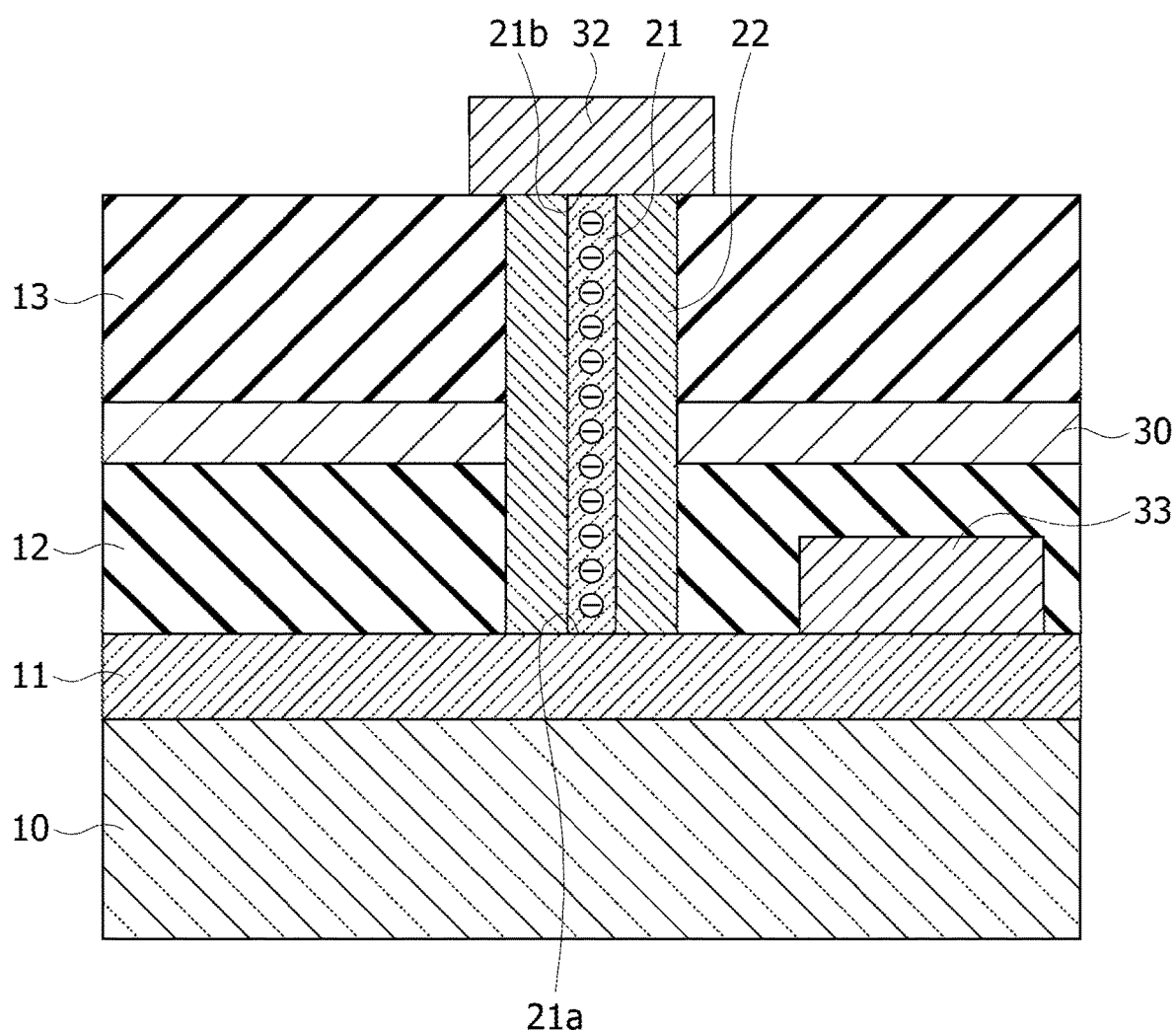
FIG. 3 is a diagram illustrating a semiconductor device according to a first embodiment (1)

Specifically, as illustrated in FIG. 3, the semiconductor device according to this embodiment includes a semiconductor substrate 10, a conductive semiconductor layer 11 disposed on the semiconductor substrate 10, an electron transit region 21 disposed on the conductive semiconductor layer 11, which is a semiconductor nanowire that extends substantially perpendicular to the surface of the semiconductor substrate 10, and an electron supply region 22 disposed on the periphery of the side surface of the electron transit region 21, which is a semiconductor nanowire, so as to cover the side surface of the semiconductor nanowire.

On a portion of the surface of the conductive semiconductor layer 11 which is other than the portion of the surface of the conductive semiconductor layer 11 on which the electron transit region 21 and the electron supply region 22 are disposed, an insulating film 12, a gate electrode layer 30, an interlayer insulating film 13, and the like are stacked on top of one another. A source electrode 32 is disposed on another end 21b of the electron transit region 21. An end 21a of the electron transit region 21 that is a semiconductor nanowire, the end 21a facing a drain electrode 33, is electrically connected to the conductive semiconductor layer 11, while the other end 21b is electrically connected to the source electrode 32. The drain electrode 33 is disposed on the conductive semiconductor layer 11.

The electron transit region 21 of the semiconductor device according to this embodiment is an i-InAs semiconductor nanowire. The electron supply region 22 disposed on the periphery of the side surface of the electron transit region 21 is composed of n-InAlAs. This enables generation of an electron gas in a portion of the electron transit region 21 which is in the vicinity of the interface between the electron transit region 21 and the electron supply region 22, which reduces the electric resistance between the gate electrode layer 30 and the source electrode 32. As a result, the semiconductor device may be operated at a high speed and have a suitable high-frequency characteristic. In this embodiment, the diameter of the electron transit region 21, which is a semiconductor nanowire, may be 20 to 200 nm and is, for example, about 100 nm, and the thickness of the electron supply region 22 is 5 to 30 nm. In this embodiment, n-InAlAs constituting the electron supply region 22 is doped with an impurity element that is $1 \times 10^{18}$ to $2 \times 10^{19}$ cm$^{-3}$ Si. The electron transit region 21 of the semiconductor device according to this embodiment may be composed of a compound semiconductor that includes In, such as InGaAs, InSb, or InGaSb, instead of InAs. InAlAs constituting the electron supply region 22, which includes In, advantageously makes it easy to provide lattice match between InAlAs and the material constituting the electron transit region 21 because InAlAs has a lattice constant close to that of InAs.

Figure 4:
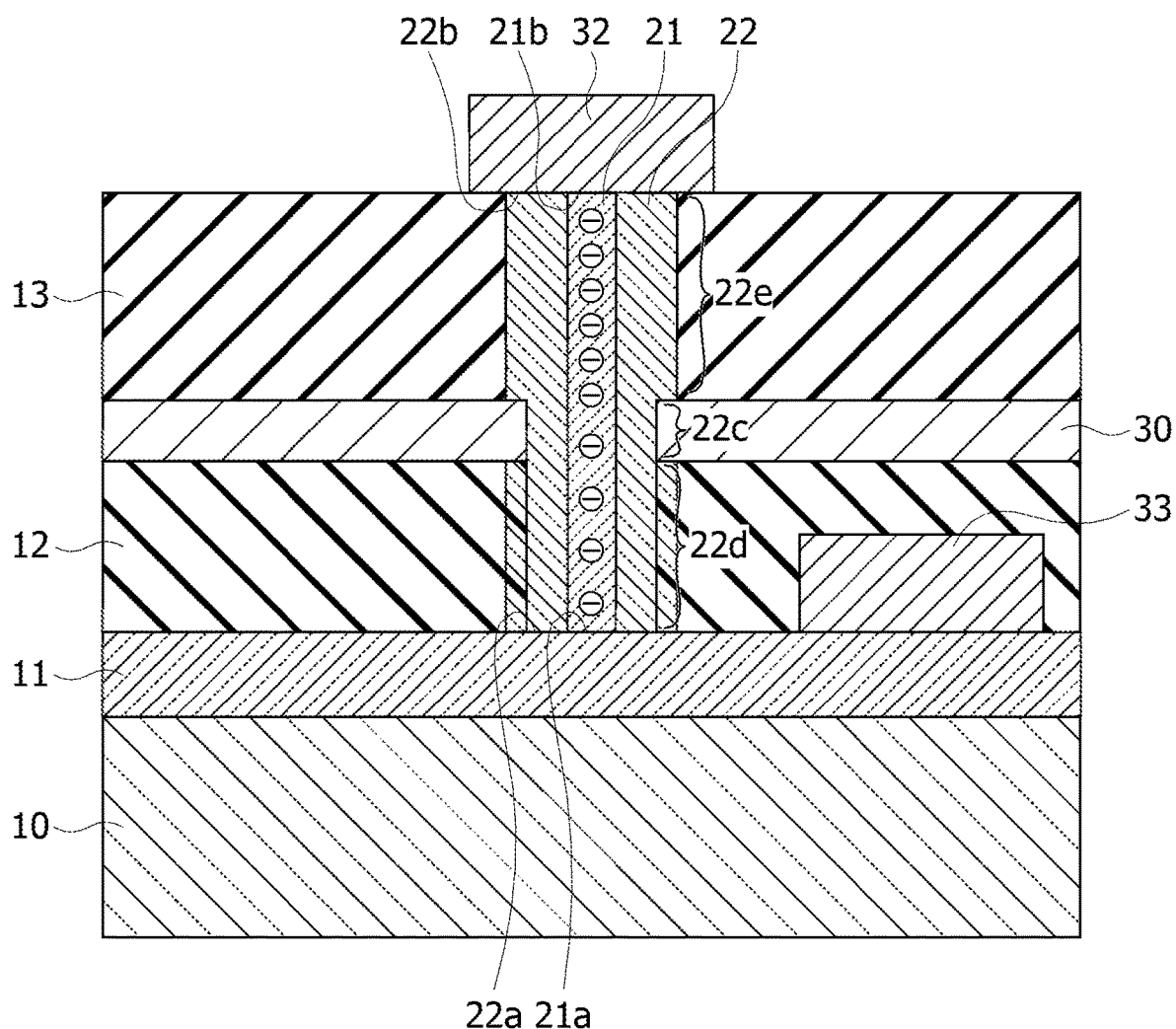
FIG. 4 is a diagram illustrating a semiconductor device according to a first embodiment (2)

The thickness of the electron supply region 22 of the semiconductor device according to this embodiment may vary by portion as illustrated in FIG. 4. Specifically, a portion 22e of the electron supply region 22 which extends from the upper edge of the gate electrode layer 30 to the other end 22b of the electron supply region 22 which faces the source electrode 32 may have a larger thickness than both of a portion 22c of the electron supply region 22 which is in contact with the gate electrode layer 30 and a portion 22d of the electron supply region 22 which extends from the lower edge of the gate electrode layer 30 to the end 22a of the electron supply region 22 which faces the drain electrode 33. When the portion 22e of the electron supply region 22 which extends from the upper edge of the gate electrode layer 30 toward the source electrode 32 has a larger thickness than the other portions, the density of the electron gas generated in a portion of the electron transit region 21 which corresponds to the portion 22e may become higher than in the other portions of the electron transit region 21. Accordingly, the electric resistance of the portion of the electron transit region 21, that is, the source resistance, may be reduced. This enables a suitable high-frequency characteristic to be achieved.

In the semiconductor device illustrated in FIG. 4, the portion 22c of the electron supply region 22 which is in contact with the gate electrode layer 30 has a predetermined thickness that is smaller than that of the portion 22e that extends from the upper edge of the gate electrode layer 30 toward the source electrode 32. This enables the control to be suitably done by applying a voltage to the gate electrode layer 30. In addition, the portion 22d of the electron supply region 22 which extends from the lower edge of the gate electrode layer 30 toward the drain electrode 33 has a smaller thickness than the portion 22e that extends from the upper edge of the gate electrode layer 30 toward the source electrode 32. This reduces the drain conductance.

Figure 5:
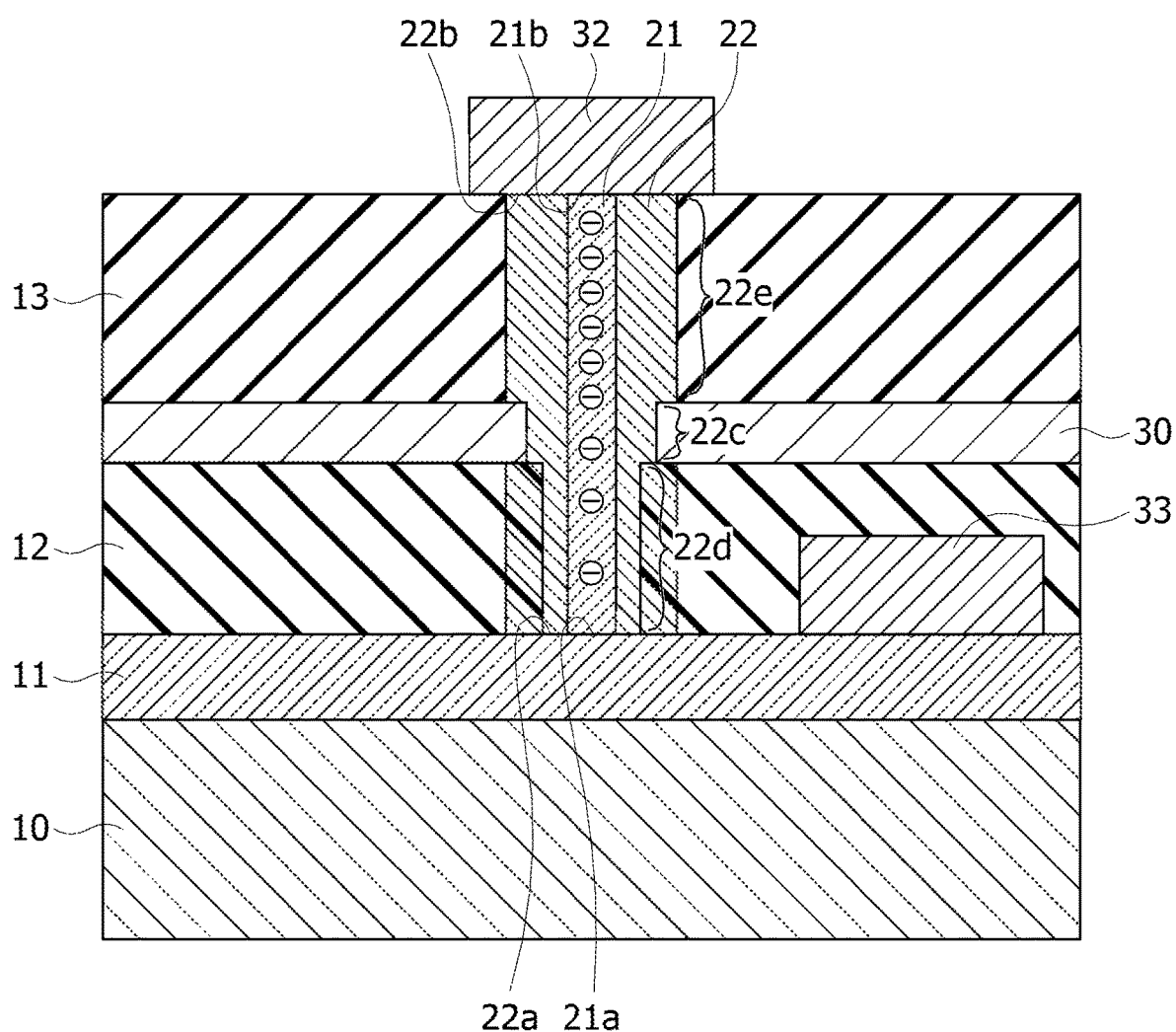
FIG. 5 is a diagram illustrating a semiconductor device according to a first embodiment (3)

In the semiconductor device according to this embodiment, the portion 22d of the electron supply region 22 which extends from the lower edge of the gate electrode layer 30 toward the drain electrode 33 may have a smaller thickness than the portion 22c that is in contact with the gate electrode layer 30, as illustrated in FIG. 5. That is, the portion 22c of the electron supply region 22 which is in contact with the gate electrode layer 30 may have a smaller thickness than the portion 22e that extends from the upper edge of the gate electrode layer 30 toward the source electrode 32, and the portion 22d of the electron supply region 22 which extends from the lower edge of the gate electrode layer 30 toward the drain electrode 33 may have a smaller thickness than the portion 22c which is in contact with the gate electrode layer 30. This may further reduce the drain conductance.

In the semiconductor device according to this embodiment, since the thickness of the gate electrode layer 30 is the length of the gate, it is possible to readily reduce the length of the gate by controlling the thickness of the gate electrode layer 30. It is possible to achieve a suitable high-frequency characteristic by reducing the length of the gate in the above manner.

In the semiconductor device according to this embodiment, the positions of the source electrode and the drain electrode may be interchanged. In such a case, the electron supply region 22 may be formed so as to have a larger thickness on the source electrode-side than on the drain electrode-side. Hereinafter, the electron transit region 21 and the like are referred to as "first semiconductor region", and the electron supply region 22 is referred to as "second semiconductor region".

Method for Manufacturing Semiconductor Device

A method for manufacturing the semiconductor device according to this embodiment is described below with reference to FIGS. 6A to 11B. Although the following description is directed to a method for manufacturing the semiconductor device illustrated in FIG. 5, some of the components of the semiconductor device described below are different from those of the semiconductor device illustrated in FIG. 5 in the details for the sake of convenience. The method for manufacturing a semiconductor device described below may be used for manufacturing the other semiconductor devices having different structures according to this embodiment.

Figure 6A:
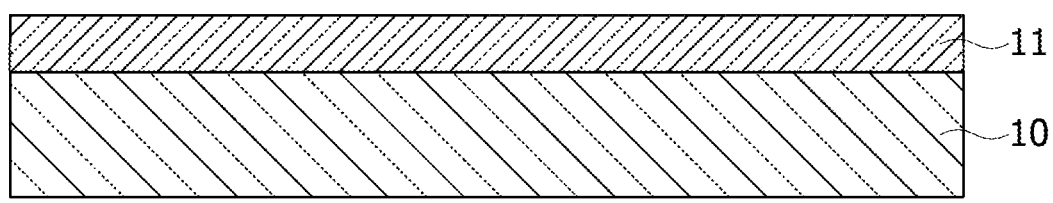
FIGS. 6A and 6B are diagrams illustrating a step of a method for manufacturing a semiconductor device according to a first embodiment (1)

First, as illustrated in FIG. 6A, a conductive semiconductor layer 11 is epitaxially grown on a semiconductor substrate 10 by metal organic chemical vapor deposition (MOCVD). The semiconductor substrate 10 is a semi-insulating (SI)—GaAs(111)B substrate that is not doped with any impurity element. The conductive semiconductor layer 11 is an n$^+$-GaAs film having a thickness of 200 nm and is doped with an impurity element that is $5 \times 10^{18}$ cm$^{-3}$ Si. In the deposition of the n$^+$-GaAs film that serves as a conductive semiconductor layer 11, trimethylgallium (TMGa), arsine (AsH$_3$), and silane (SiH$_4$) are fed as raw material gases for Ga, As, and, Si that is an impurity element, respectively.

Figure 6B:
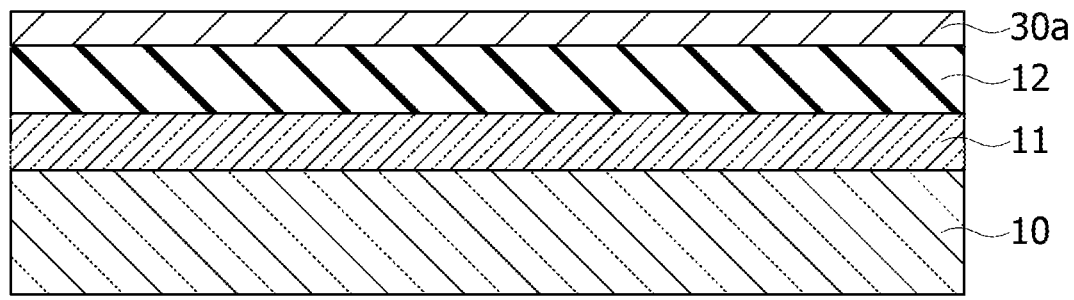

An insulating film 12 and a metal film 30a are successively formed on and above the conductive semiconductor layer 11 as illustrated in FIG. 6B. The insulating film 12 is formed by depositing a SiO$_2$ film having a thickness of about 300 nm on the conductive semiconductor layer 11 by plasma chemical vapor deposition (CVD). The metal film 30a is formed by depositing a W film having a thickness of about 50 nm on the insulating film 12 by sputtering. The metal film 30a is provided for forming the gate electrode layer 30 described below and is preferably composed of W or a metal having a relatively high melting point, such as Ta or Ti.

Figure 7A:
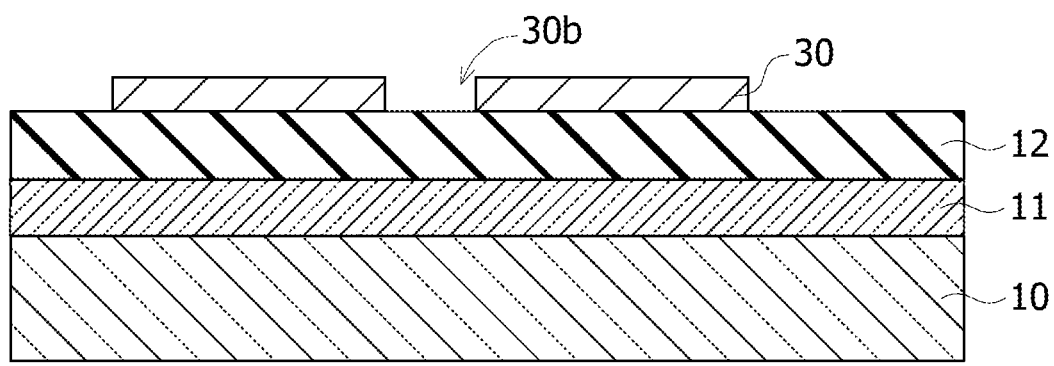
FIGS. 7A and 7B are diagrams illustrating a step of a method for manufacturing a semiconductor device according to a first embodiment (2)

The metal film 30a is formed into a gate electrode layer 30 as illustrated in FIG. 7A. Specifically, a photoresist is applied to the metal film 30a, which is exposed to light with an exposure device to develop a resist pattern (not illustrated) on the portion of the metal film 30a in which the gate electrode layer 30 is to be formed. Examples of the exposure device include an electron beam (EB) exposure device. The other portion of the metal film 30a on which the resist pattern is not formed is removed by dry etching, such as reactive ion etching (RIE). The remaining portion of the metal film 30a forms a gate electrode layer 30 with an opening 30b having a diameter of about 100 nm which is formed at the center of the gate electrode layer 30. The resist pattern (not illustrated) is subsequently removed using an organic solvent or the like.

Figure 7B:
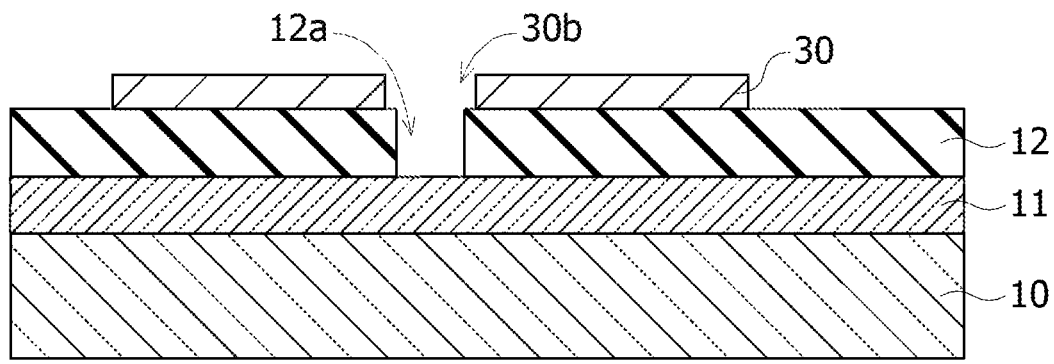

At the position of the opening 30b of the gate electrode layer 30, an opening 12a is formed in the insulating film 12 as illustrated in FIG. 7B. Specifically, a photoresist is applied to the gate electrode layer 30 and the insulating film 12, which are exposed to light with an exposure device to develop a resist pattern (not illustrated) having an opening formed on the portion of the insulating film 12 in which the opening 12a is to be formed. The other portion of the insulating film 12 on which the resist pattern is not formed is removed by dry etching, such as RIE. Hereby, the opening 12a is formed in the insulating film 12. The opening 12a has a diameter of about 80 nm. The resist pattern (not illustrated) is left on the gate electrode layer 30 and the insulating film 12.

Figure 8A:
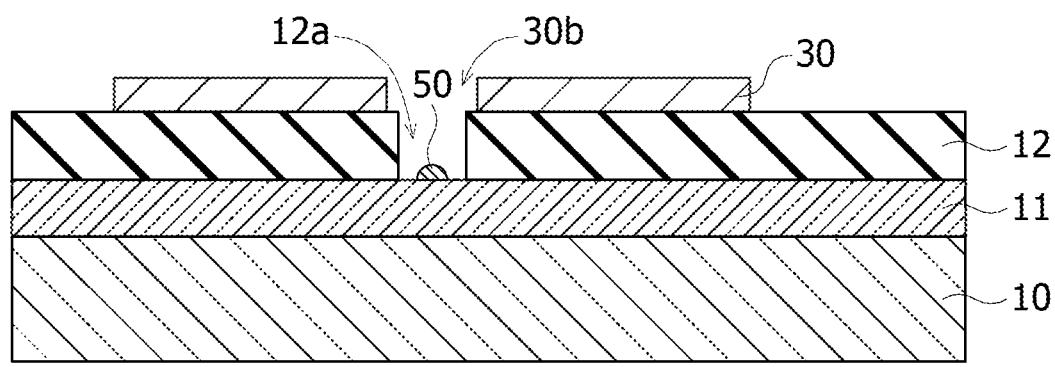
FIGS. 8A and 8B are diagrams illustrating a step of a method for manufacturing a semiconductor device according to a first embodiment (3)

A catalyst layer 50 is formed on a portion of the surface of the conductive semiconductor layer 11 which is exposed through the opening 12a of the insulating film 12 as illustrated in FIG. 8A. Specifically, an Au film having a thickness of 30 nm is deposited on the resist pattern (not illustrated) by vacuum deposition, and the multilayer body is immersed in an organic solvent in order to remove a portion of the Au film which is deposited on the resist pattern together with the resist pattern by lift-off. The other portion of the Au film which remains on the conductive semiconductor layer 11 forms a catalyst layer 50. The catalyst layer 50 catalyzes the growth of the semiconductor nanowire. The size of the catalyst layer 50 is smaller than that of the opening 12a of the insulating film 12.

Figure 8B:
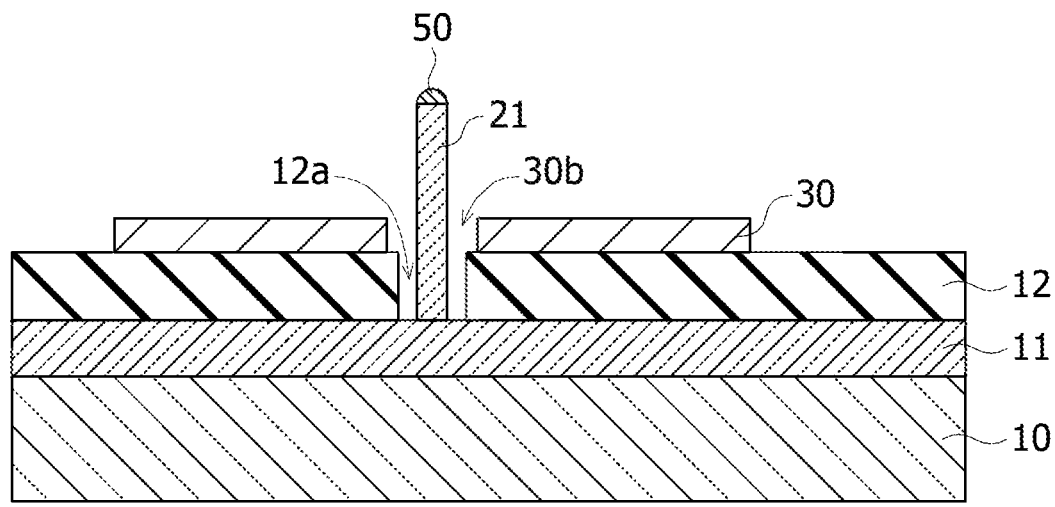

A semiconductor nanowire composed of i-InAs which serves as an electron transit region 21 is grown on the conductive semiconductor layer 11 by MOCVD or the like in a direction substantially perpendicular to the surface of the semiconductor substrate 10 as illustrated in FIG. 8B. The temperature at which the semiconductor nanowire, which serves as an electron transit region 21, is grown (hereinafter, such a temperature is referred to as "growth temperature") is about 450° C. A semiconductor nanowire having a length of 1 μm is formed by a vapor-liquid-solid (VLS) method. In the formation of the semiconductor nanowire composed of i-InAs, which serves as an electron transit region 21, for example, TMIn and AsH$_3$ may be fed as raw material gases for In and As, respectively. Alternatively, the semiconductor nanowire which serves as an electron transit region 21 may be composed of i-InGaAs.

Figure 9A:
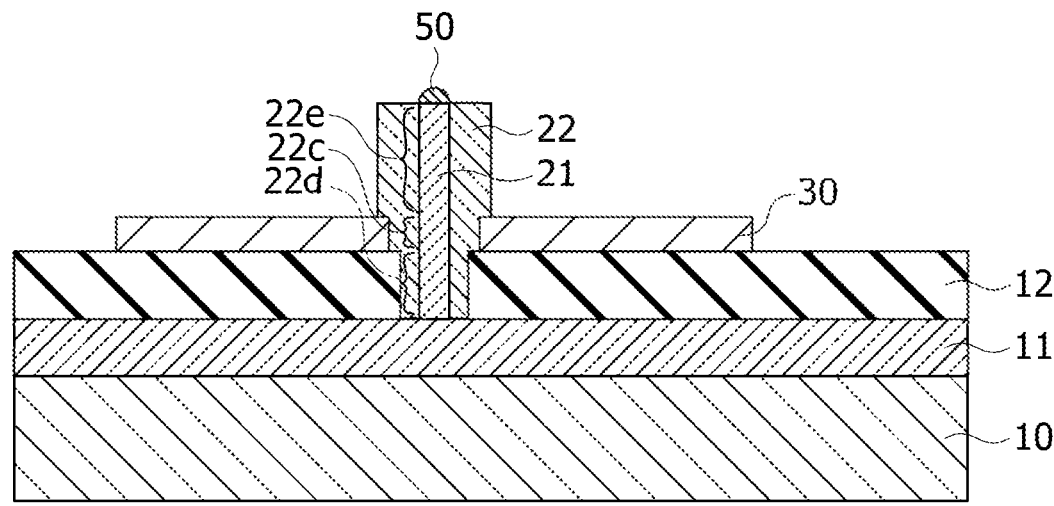
FIGS. 9A and 9B are diagrams illustrating a step of a method for manufacturing a semiconductor device according to a first embodiment (4)

An electron supply region 22 is formed on the periphery of the electron transit region 21 as illustrated in FIG. 9A. Specifically, after the growth temperature has been reduced to about 380° C., a crystal of n-InAlAs is grown on the periphery of the side surface of the semiconductor nanowire, which serves as an electron transit region 21, to form an electron supply region 22. In this embodiment, when the growth temperature is about 450° C., which is relatively high, a crystal of the compound semiconductor grows in a direction substantially perpendicular to the surface of the semiconductor substrate 10 to form a semiconductor nanowire. On the other hand, when the growth temperature is about 380° C., which is relatively low, a crystal of the compound semiconductor grows on the side surface of the semiconductor nanowire. That is, a crystal of the compound semiconductor grows in a direction substantially parallel to the surface of the semiconductor substrate 10. As a result, an electron supply region 22 composed of n-InAlAs is formed on the periphery of the side surface of the semiconductor nanowire which serves as an electron transit region 21. In the formation of the electron supply region 22 composed of n-InAlAs, for example, TMIn, trimethylaluminum (TMAl), AsH$_3$, and SiH$_4$ may be fed as raw material gases for In, Al, As, and Si that is an impurity element, respectively.

The electron supply region 22 fills the gap between the semiconductor nanowire which serves as an electron transit region 21 and the insulating film 12 and the gap between the semiconductor nanowire and the gate electrode layer 30 and keeps growing in the region in which neither the insulating film 12 nor the gate electrode layer 30 is formed. As a result, the thickness of the portion 22c of the electron supply region 22 which is in contact with the gate electrode layer 30, which is determined by the gate electrode layer 30, becomes larger than the thickness of the portion 22d that extends from the gate electrode layer 30 toward the drain electrode 33, which is determined by the insulating film 12. The thickness of the portion 22e of the electron supply region 22 which extends from the gate electrode layer 30 toward the source electrode 32, which is determined by no component, becomes larger than the thickness of the portion 22c which is in contact with the gate electrode layer 30, which is determined by the gate electrode layer 30.

Figure 9B:
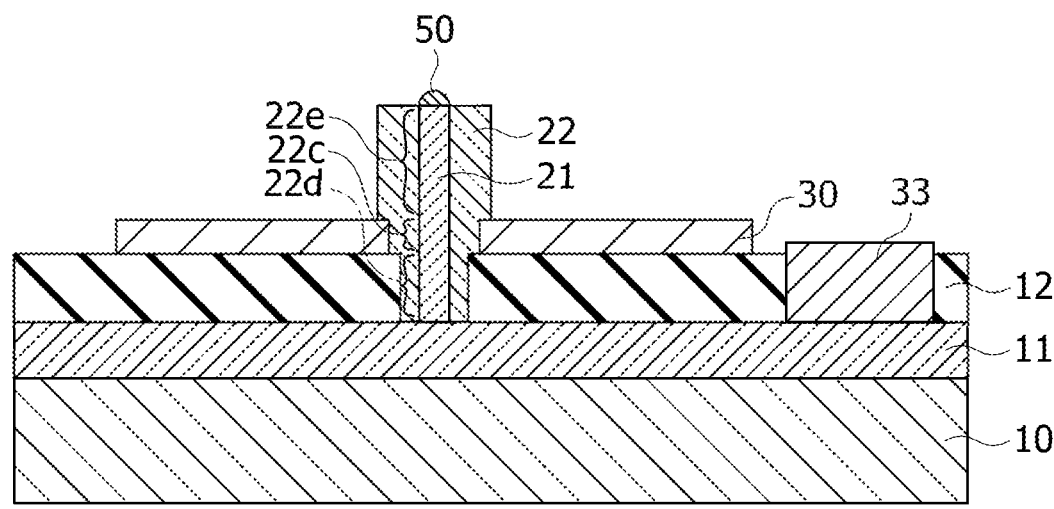

A drain electrode 33 is formed on the conductive semiconductor layer 11 as illustrated in FIG. 9B. Specifically, a photoresist is applied to the insulating film 12, the gate electrode layer 30, the electron supply region 22, and the catalyst layer 50, which are exposed to light with an exposure device to develop a resist pattern (not illustrated) having an opening formed at the position at which the drain electrode 33 is to be formed. A portion of the insulating film 12 which is exposed through the opening of the resist pattern is removed by dry etching, such as RIE. Hereby, a portion of the surface of the conductive semiconductor layer 11 is exposed through the opening. Subsequently, an AuGe/Au multilayer metal film is deposited on the conductive semiconductor layer 11 and the resist pattern by vacuum deposition. The multilayer body is then immersed in an organic solvent or the like in order to remove a portion of the multilayer metal film which is deposited on the resist pattern together with the resist pattern by lift-off. The other portion of the multilayer metal film which remains on the conductive semiconductor layer 11 forms a drain electrode 33. The multilayer metal film includes an AuGe film having a thickness of 20 nm and an Au film having a thickness of 400 nm which are stacked on top of one another. Subsequently, a heat treatment is performed in order to achieve an ohmic contact.

Figure 10A:
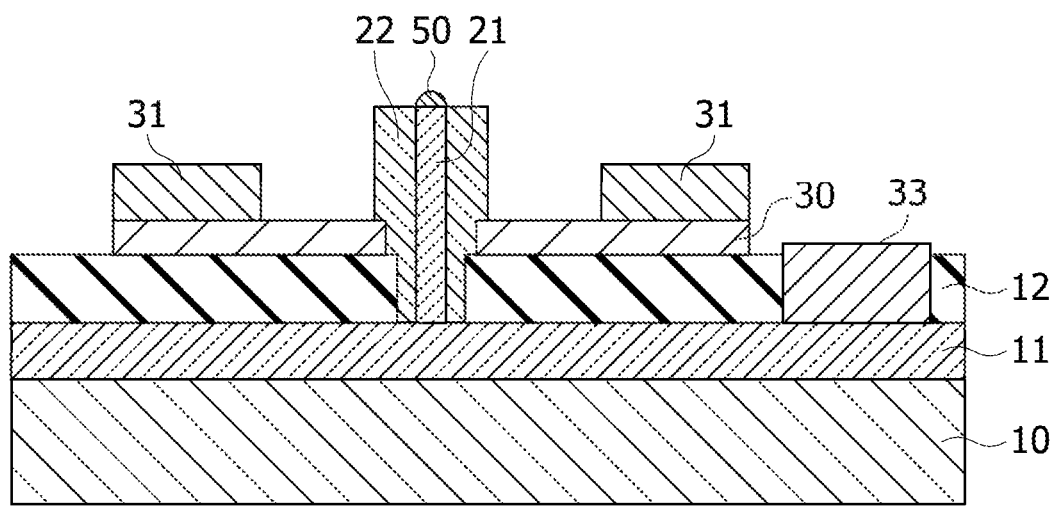
FIGS. 10A and 10B are diagrams illustrating a step of a method for manufacturing a semiconductor device according to a first embodiment (5)

A gate electrode 31 is formed on the gate electrode layer 30 as illustrated in FIG. 10A. Specifically, a photoresist is applied to the insulating film 12, the gate electrode layer 30, the electron supply region 22, the catalyst layer 50, and the drain electrode 33, which are exposed to light with an exposure device to develop a resist pattern (not illustrated) having an opening formed at the position at which the gate electrode 31 is to be formed. A multilayer metal film composed of Ti/Pt/Au is deposited on the resist pattern by vacuum deposition. The multilayer body is then immersed in an organic solvent or the like in order to remove a portion of the multilayer metal film which is deposited on the resist pattern together with the resist pattern by lift-off. The other portion of the multilayer metal film which remains on the gate electrode layer 30 forms a gate electrode 31. The multilayer metal film includes a Ti film having a thickness of 10 nm, a Pt film having a thickness of 30 nm, and an Au film having a thickness of 300 nm which are stacked on top of one another.

Figure 10B:
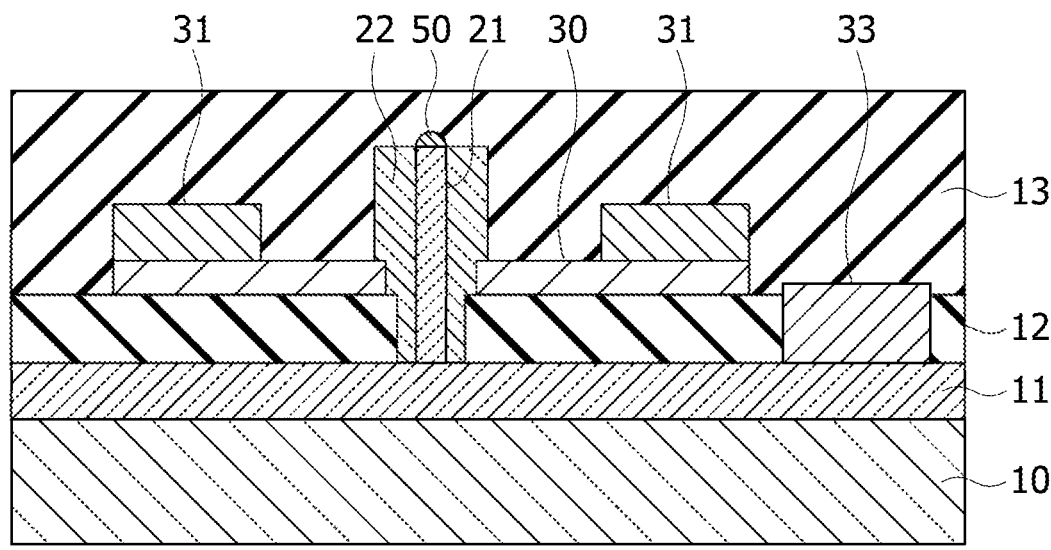

An interlayer insulating film 13 that covers the insulating film 12, the gate electrode layer 30, the electron supply region 22, the catalyst layer 50, the drain electrode 33, and the gate electrode 31 is formed as illustrated in FIG. 10B. Specifically, benzocyclobutene (BCB) or the like is applied to the insulating film 12, the gate electrode layer 30, the electron supply region 22, the catalyst layer 50, the drain electrode 33, and the gate electrode 31 with a spin coater. The resulting coating film is cured by heating to form an interlayer insulating film 13.

Figure 11A:
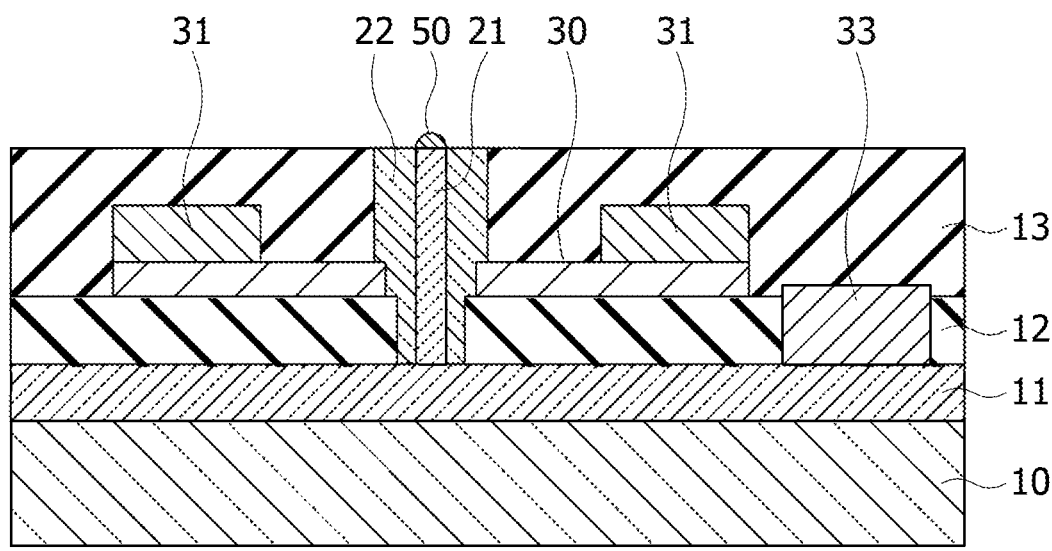
FIGS. 11A and 11B are diagrams illustrating a step of a method for manufacturing a semiconductor device according to a first embodiment (6)

The interlayer insulating film 13 is etched back such that the electron supply region 22 and the catalyst layer 50 are exposed at the surface of the interlayer insulating film 13 as illustrated in FIG. 11A. Specifically, the interlayer insulating film 13 is etched back from the surface by RIE using a fluorine-containing gas such that the electron supply region 22 and the catalyst layer 50 are exposed.

Figure 11B:
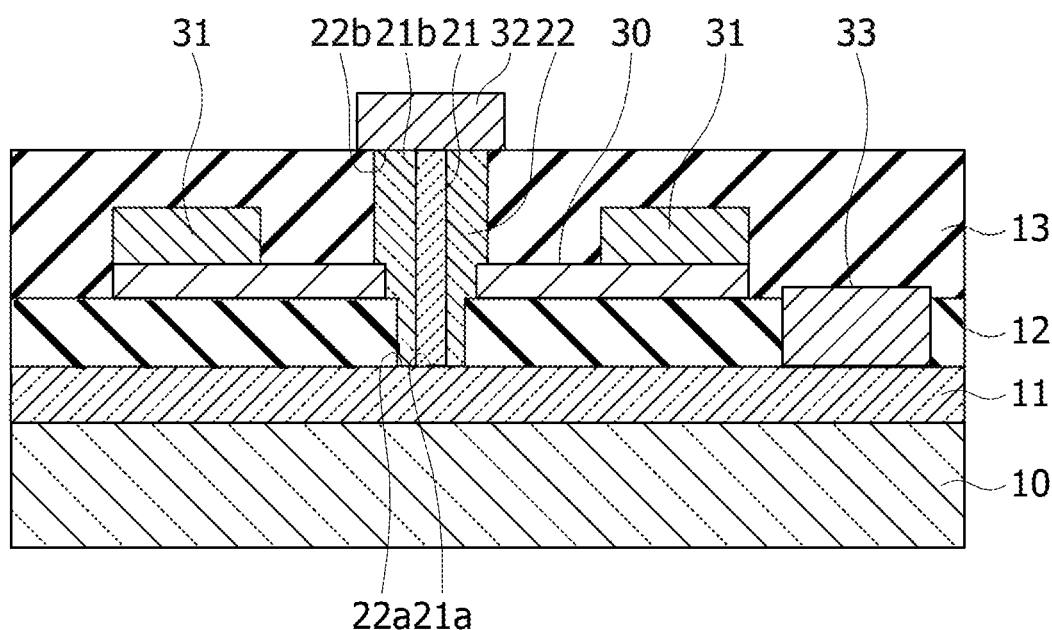

A source electrode 32 is formed on the electron transit region 21 and the electron supply region 22 as illustrated in FIG. 11B. Specifically, a photoresist is applied to the interlayer insulating film 13, the electron supply region 22, and the catalyst layer 50, which are exposed to light with an exposure device to develop a resist pattern (not illustrated) having an opening formed at the position at which the source electrode 32 is to be formed. An Au film is formed on the resist pattern by vacuum deposition or the like. The multilayer body is then immersed in an organic solvent in order to remove a portion of the Au film which is deposited on the resist pattern together with the resist pattern by lift-off. Hereby, a source electrode 32 is formed on the upper ends of the electron transit region 21 and the electron supply region 22, that is, on the other end 21*b* of the electron transit region 21 and the other end 22*b* of the electron supply region 22. The catalyst layer 50 coalesces with the Au film to form a part of the source electrode 32. The source electrode 32 may be formed by plating or the like. Instead of an Au film, an electrode capable of forming an ohmic contact with the i-InAs layer 21, such as Ti/Pt/Au or AuGe/Au, may be used.

Hereinafter, the gate electrode layer 30 may be referred to as "gate electrode". The gate electrode layer 30 and the gate electrode 31 may be referred to collectively as "gate electrode".

The semiconductor device according to this embodiment is produced by the above-described process.

Second Embodiment

A semiconductor device according to the second embodiment is described below. The semiconductor device according to this embodiment is a semiconductor device that includes a semiconductor nanowire and has a HEMT structure in which the electron transit region is constituted by two semiconductor nanowires composed of different materials.

Figure 12:
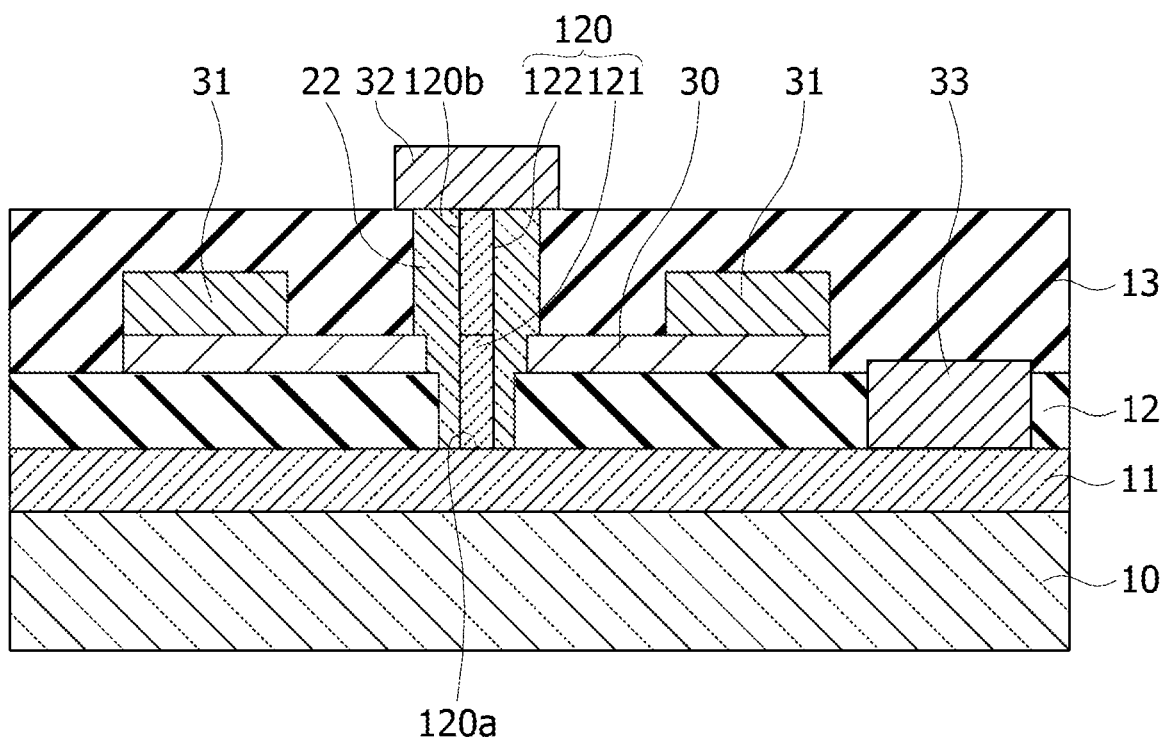
FIG. 12 is a diagram illustrating a semiconductor device according to a second embodiment.

Specifically, as illustrated in FIG. 12, the semiconductor device according to this embodiment includes a semiconductor substrate 10, a conductive semiconductor layer 11 disposed on the semiconductor substrate 10, an electron transit region 120 disposed on the conductive semiconductor layer 11 which is a semiconductor nanowire that extends substantially perpendicular to the surface of the semiconductor substrate 10, and an electron supply region 22 disposed on the periphery of the side surface of the electron transit region 120, which is a semiconductor nanowire, so as to cover the side surface of the semiconductor nanowire.

On a portion of the surface of the conductive semiconductor layer 11 which is other than the portion of the surface of the conductive semiconductor layer 11 on which the electron transit region 120 and the electron supply region 22 are disposed, an insulating film 12, a gate electrode layer 30, an interlayer insulating film 13, and the like are stacked on top of one another. A source electrode 32 is disposed on the electron transit region 120 and the electron supply region 22.

The electron transit region 120 that is a semiconductor nanowire is constituted by a first portion 121 and a second portion 122 that face the drain electrode 33 and the source electrode 32, respectively. The first portion 121 and the second portion 122 are connected to each other in the vicinity of the center of the semiconductor nanowire. An end 120*a* of the electron transit region 120 which faces the drain electrode 33 is electrically connected to the conductive semiconductor layer 11, while the other end 120*b* of the electron transit region 120 is electrically connected to the source electrode 32. That is, the end 120*a* of the electron transit region 120, which is the end of the first portion 121 of the electron transit region 120, is electrically connected to the drain electrode 33 with the conductive semiconductor layer 11, while the other end 120*b* of the electron transit region 120, which is the end of the second portion 122, is connected to the source electrode 32.

The first portion 121 of the electron transit region 120 corresponds to the portion of the electron supply region 22 which is in contact with the gate electrode layer 30 and the portion of the electron supply region 22 which extends from the gate electrode layer 30 toward the drain electrode 33 and is composed of i-InSb. The second portion 122 corresponds to the portion of the electron supply region 22 which extends from the gate electrode layer 30 toward the source electrode 32 and is composed of i-InAs. Since the portion of the electron transit region 120 which corresponds to the portion of the electron supply region 22 which is in contact with the gate electrode layer 30 is composed of InSb, which has a narrower bandgap than InAs, it is possible to increase the speed at which the control is made in accordance with the voltage applied to the gate electrode layer 30. This enhances the high-frequency characteristic of the semiconductor device.

In this embodiment, the diameter of the electron transit region 120, which is a semiconductor nanowire, may be 20 to 200 nm and is, for example, about 100 nm.

Method for Manufacturing Semiconductor Device

A method for manufacturing the semiconductor device according to this embodiment is described below with reference to FIGS. 13A to 18B.

Figure 13A:
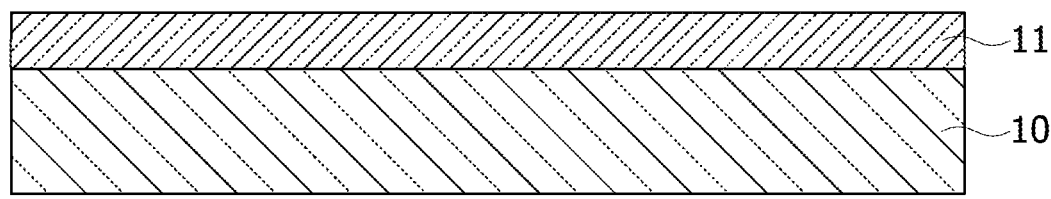
FIGS. 13A and 13B are diagrams illustrating a step of a method for manufacturing a semiconductor device according to a second embodiment (1)

First, as illustrated in FIG. 13A, a conductive semiconductor layer 11 is epitaxially grown on a semiconductor substrate 10 by MOCVD.

Figure 13B:
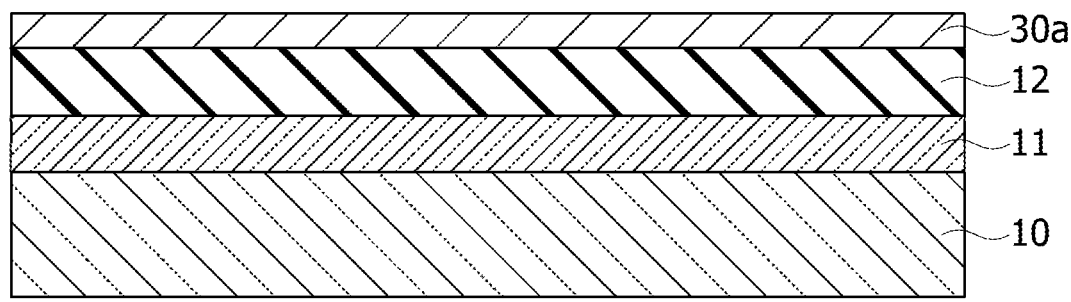

An insulating film 12 and a metal film 30*a* are successively formed on the conductive semiconductor layer 11 as illustrated in FIG. 13B.

Figure 14A:
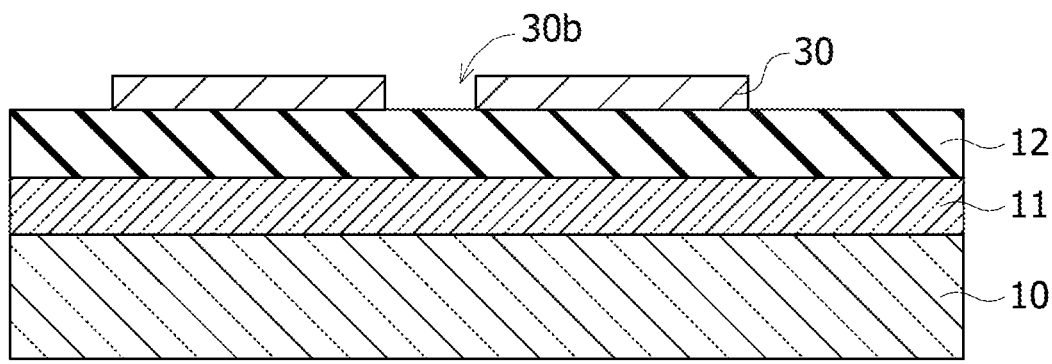
FIGS. 14A and 14B are diagrams illustrating a step of a method for manufacturing a semiconductor device according to a second embodiment (2)

The metal film 30*a* is formed into a gate electrode layer 30 having an opening 30*b* as illustrated in FIG. 14A.

Figure 14B:
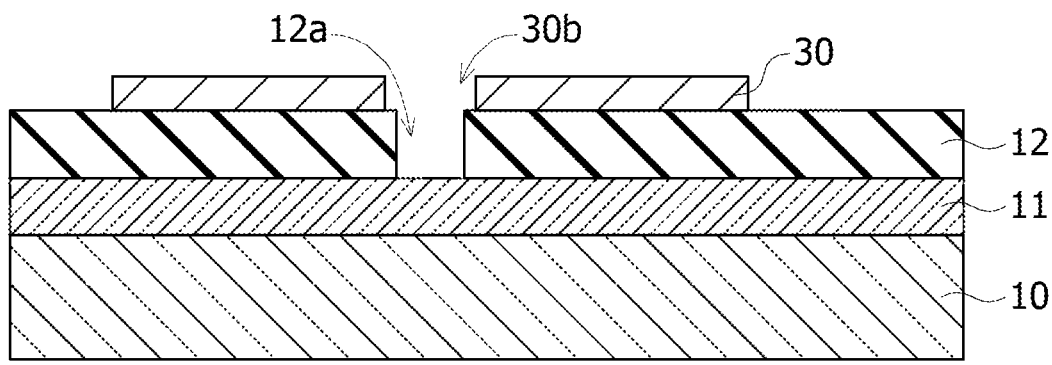

At the position of the opening 30*b* of the gate electrode layer 30, an opening 12*a* is formed in the insulating film 12 as illustrated in FIG. 14B.

Figure 15A:
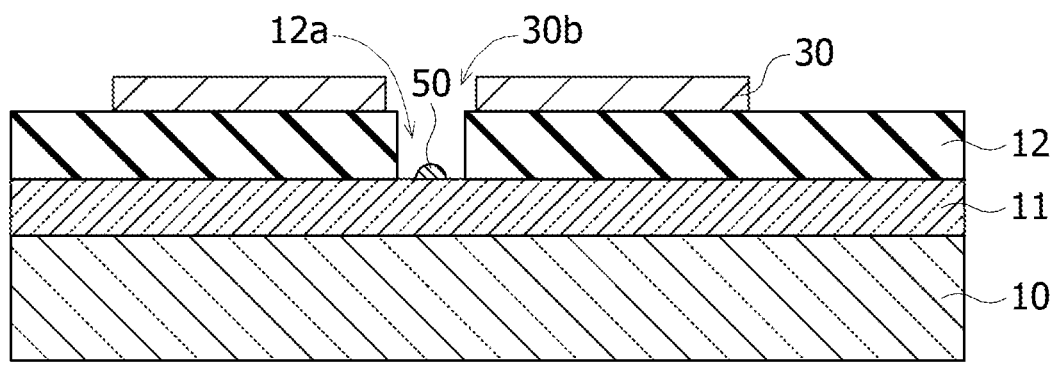
FIGS. 15A and 15B are diagrams illustrating a step of a method for manufacturing a semiconductor device according to a second embodiment (3)

A catalyst layer 50 is formed on a portion of the conductive semiconductor layer 11 which is exposed through the opening 12*a* of the insulating film 12 as illustrated in FIG. 15A.

Figure 15B:
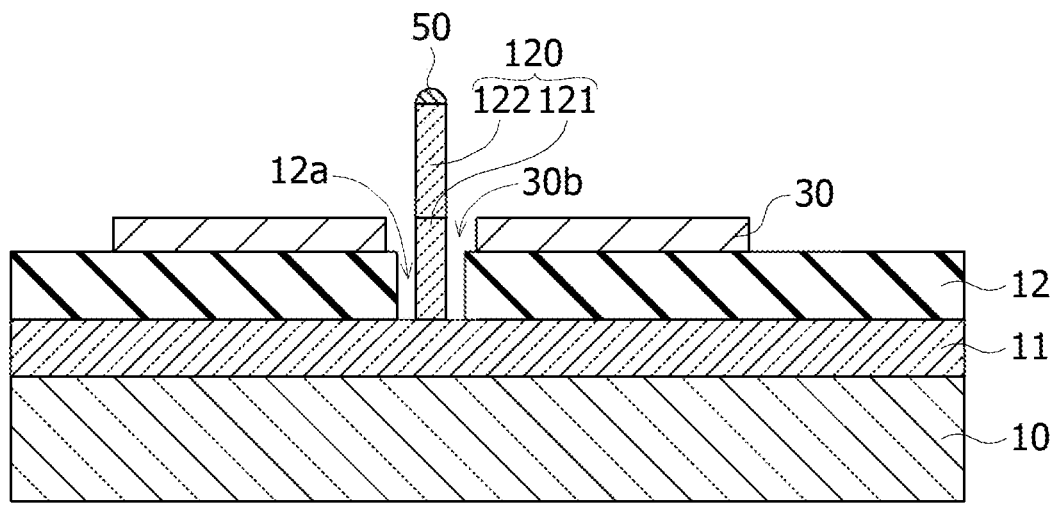

A semiconductor nanowire which serves as an electron transit region 120 is grown on the conductive semiconductor layer 11 by MOCVD or the like in a direction substantially perpendicular to the surface of the semiconductor substrate 10 as illustrated in FIG. 15B. The temperature at which the semiconductor nanowire, which serves as an electron transit region 120, is grown is about 450° C. A semiconductor nanowire having a length of 1 μm is formed by a VLS method. In the formation of the electron transit region 120, a semiconductor nanowire that serves as a first portion 121 is formed using i-InSb and, subsequently, a semiconductor nanowire that serves as a second portion 122 is formed using i-InAs.

In the formation of the i-InSb semiconductor nanowire that serves as a first portion 121, for example, TMIn and trimethylantimony (TMSb) may be used as raw materials. In the formation of the i-InAs semiconductor nanowire that serves as a second portion 122, for example, TMIn and $AsH_3$ may be used as raw materials. Alternatively, the semiconductor nanowire that serves as a second portion 122 of the electron transit region 120 may be composed of i-InGaAs.

Figure 16A:
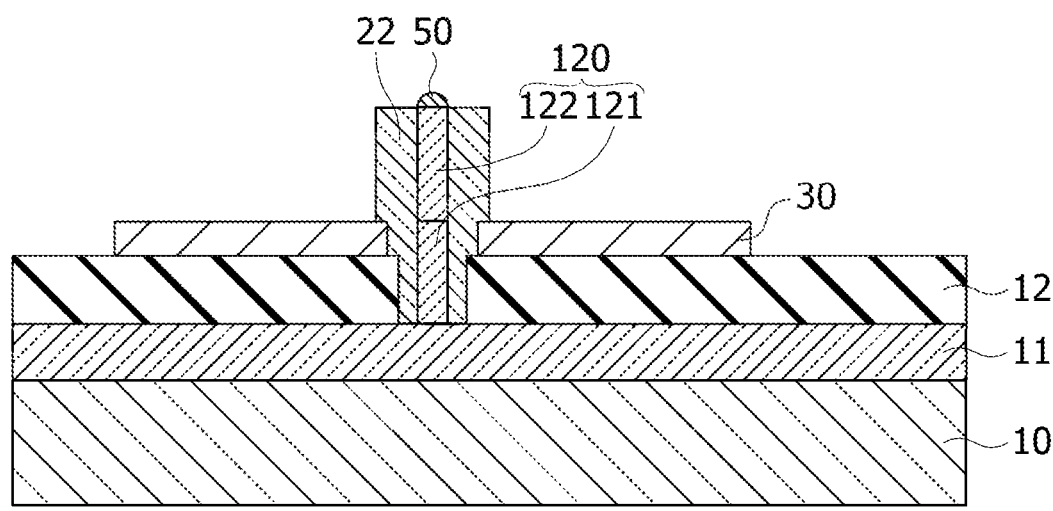
FIGS. 16A and 16B are diagrams illustrating a step of a method for manufacturing a semiconductor device according to a second embodiment (4)

An electron supply region 22 is formed on the periphery of the electron transit region 120 as illustrated in FIG. 16A. Specifically, after the growth temperature has been reduced to about 380° C., a crystal of n-InAlAs is grown on the periphery of the side surface of the semiconductor nanowire which serves as an electron transit region 120 to form an electron supply region 22.

The electron supply region 22 fills the gap between the semiconductor nanowire which serves as an electron transit region 120 and the insulating film 12 to form the portion that extends from gate electrode layer 30 toward the drain electrode 33. The electron supply region 22 also fills the gap between the semiconductor nanowire and the gate electrode layer 30 to form the portion that is in contact with the gate electrode layer 30. The electron supply region 22 keeps growing in the region in which neither the insulating film 12 nor the gate electrode layer 30 is formed and forms the portion that extends from the gate electrode layer 30 toward the source electrode 32.

Figure 16B:
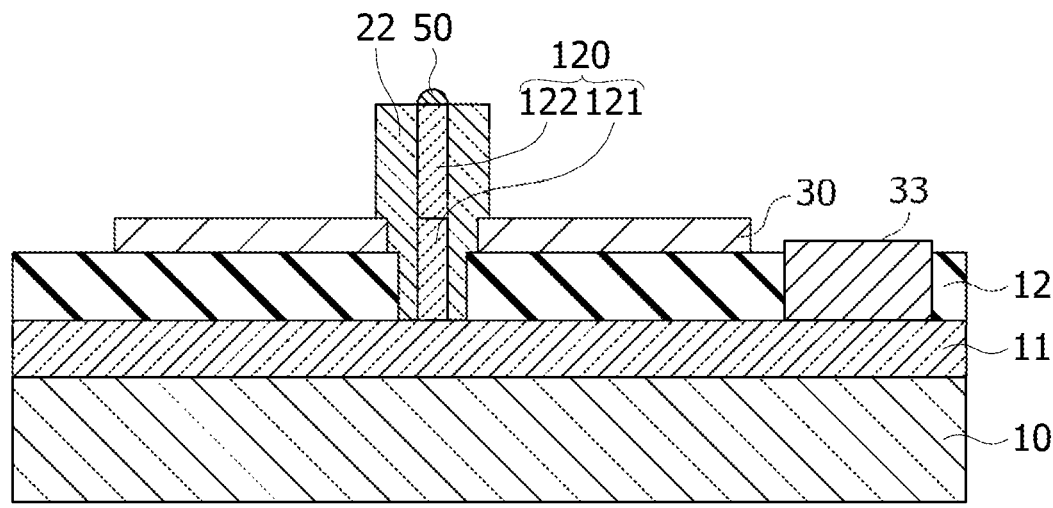
Figure 17A:
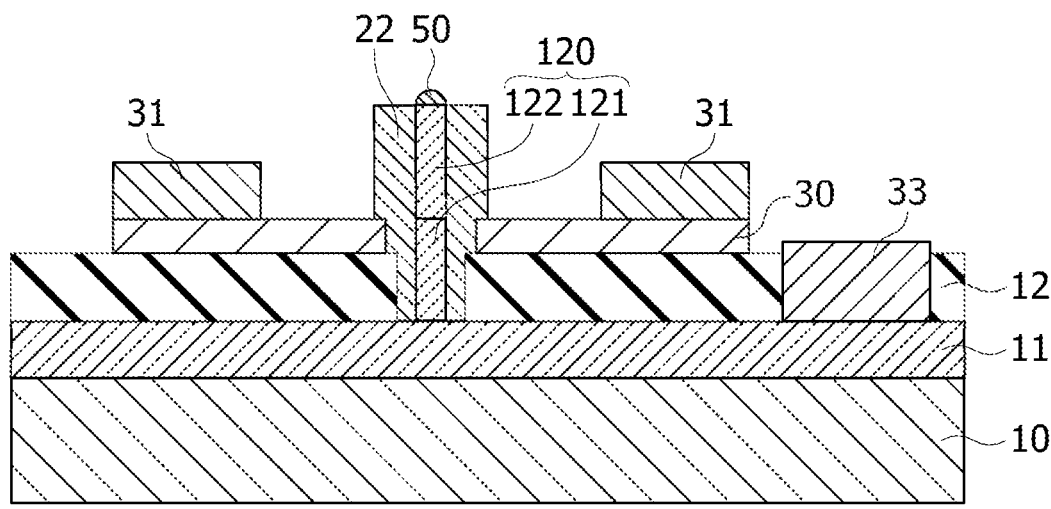
FIGS. 17A and 17B are diagrams illustrating a step of a method for manufacturing a semiconductor device according to a second embodiment (5)
Figure 17B:
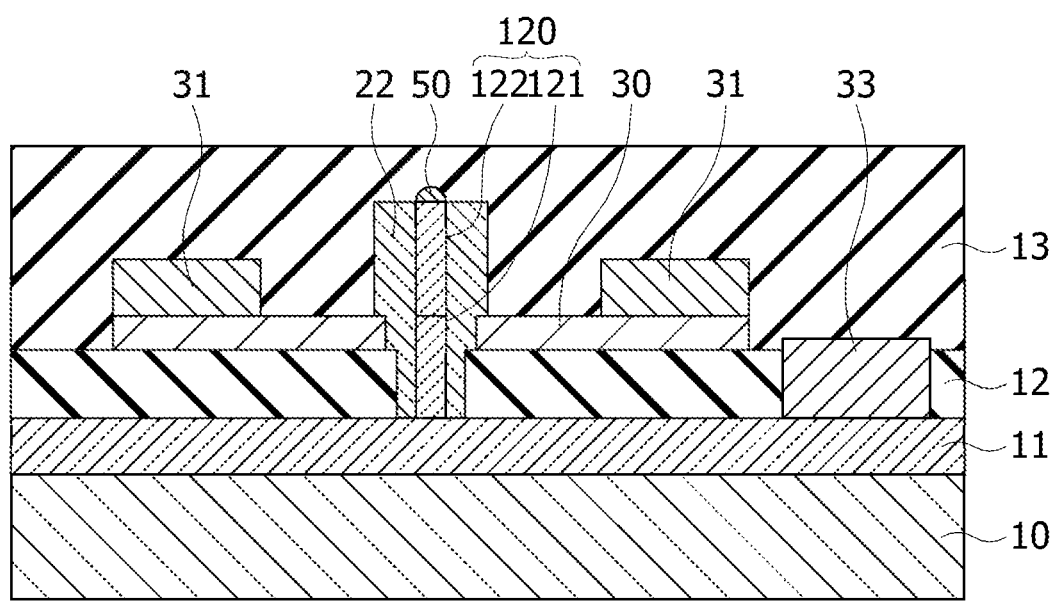

A drain electrode 33 is formed on the conductive semiconductor layer 11 as illustrated in FIG. 16B. A gate electrode 31 is formed on the gate electrode layer 30 as illustrated in FIG. 17A. An interlayer insulating film 13 that covers the insulating film 12, the gate electrode layer 30, the electron supply region 22, the catalyst layer 50, the drain electrode 33, and the gate electrode 31 is formed as illustrated in FIG. 17B.

Figure 18A:
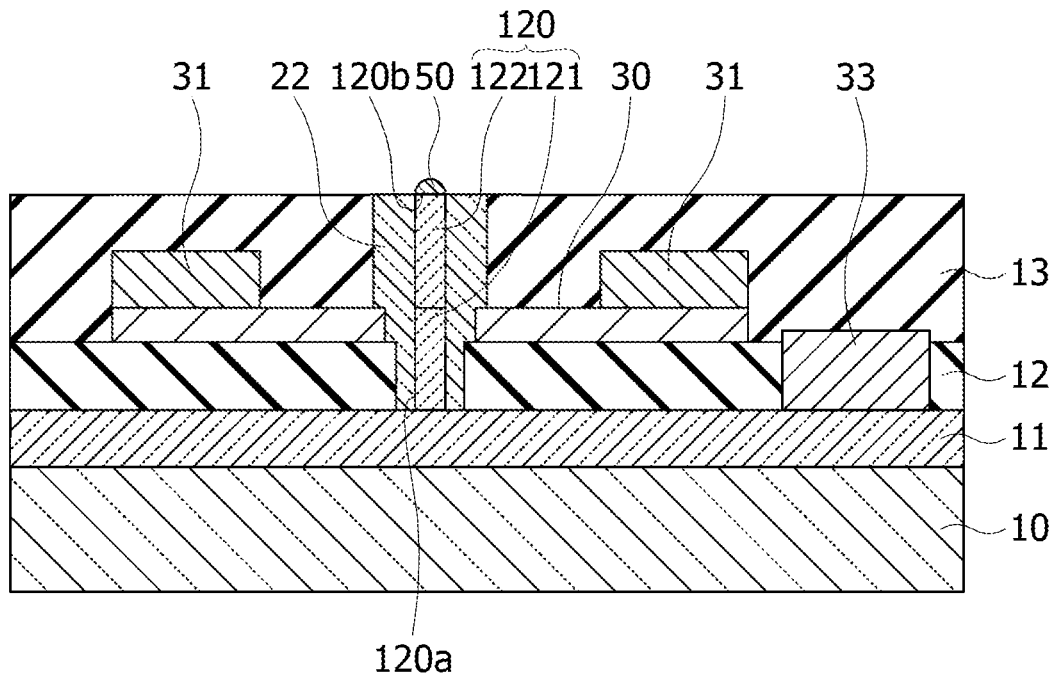
FIGS. 18A and 18B are diagrams illustrating a step of a method for manufacturing a semiconductor device according to a second embodiment (6)

The interlayer insulating film 13 is etched back such that the electron supply region 22 and the catalyst layer 50 are exposed at the surface of the interlayer insulating film 13 as illustrated in FIG. 18A.

Figure 18B:
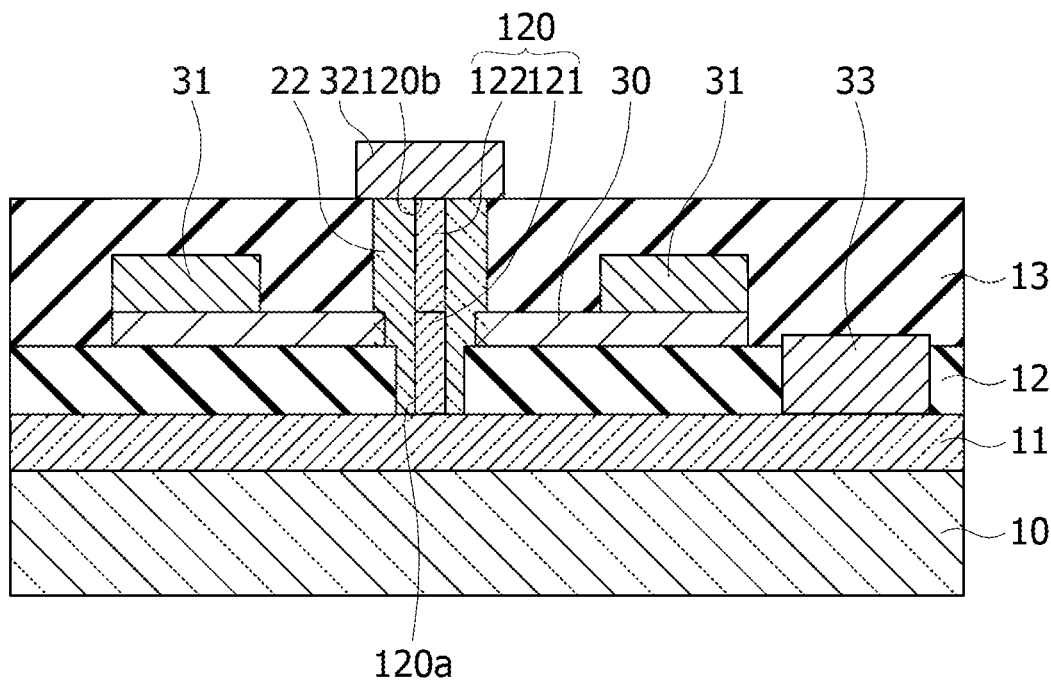

A source electrode 32 is formed on the electron transit region 120 and the electron supply region 22 as illustrated in FIG. 18B.

The semiconductor device according to this embodiment is produced by the above-described process.

Details of the production method other than described above are the same as in the first embodiment.

Third Embodiment

A semiconductor device according to the third embodiment is described below. In the semiconductor device according to this embodiment, a portion of the semiconductor nanowire that serves as an electron transit region is doped with an impurity element.

Figure 19:
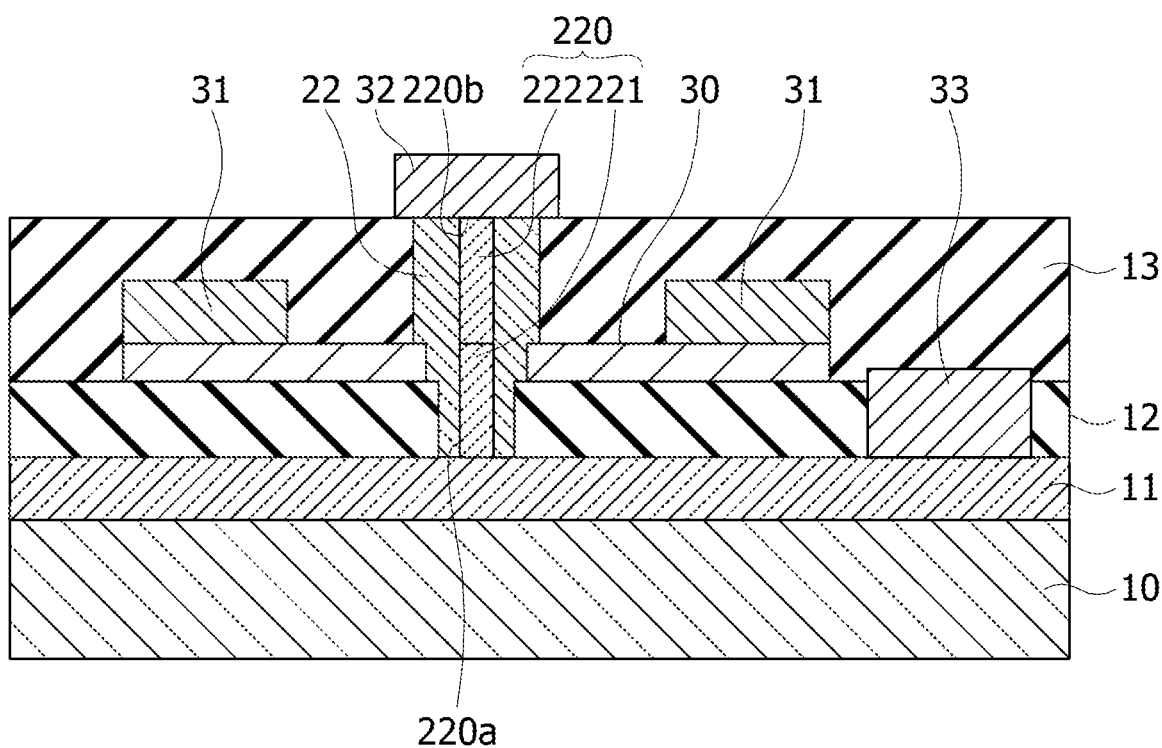
FIG. 19 is a diagram illustrating a semiconductor device according to a third embodiment.

Specifically, as illustrated in FIG. 19, the semiconductor device according to this embodiment includes a semiconductor substrate 10, a conductive semiconductor layer 11 disposed on the semiconductor substrate 10, an electron transit region 220 disposed on the conductive semiconductor layer 11 which is a semiconductor nanowire that extends substantially perpendicular to the surface of the semiconductor substrate 10, and an electron supply region 22 disposed on the periphery of the side surface of the electron transit region 220, which is a semiconductor nanowire, so as to cover the side surface of the semiconductor nanowire.

On a portion of the surface of the conductive semiconductor layer 11 which is other than the portion of the surface of the conductive semiconductor layer 11 on which the electron transit region 220 and the electron supply region 22 are disposed, an insulating film 12, a gate electrode layer 30, an interlayer insulating film 13, and the like are stacked on top of one another. A source electrode 32 is disposed on the electron transit region 220 and the electron supply region 22.

The electron transit region 220 that is a semiconductor nanowire is constituted by a first portion 221 and a second portion 222 that face the drain electrode 33 and the source electrode 32, respectively. The first portion 221 and the second portion 222 are connected to each other in the vicinity of the center of the semiconductor nanowire. An end 220a of the electron transit region 220 which faces the drain electrode 33 is electrically connected to the conductive semiconductor layer 11, while the other end 220b is electrically connected to the source electrode 32. That is, the end 220a of the electron transit region 220, which is the end of the first portion 221 of the electron transit region 220, is electrically connected to the drain electrode 33 with the conductive semiconductor layer 11, while the other end 220b, which is the end of the second portion 222, is connected to the source electrode 32.

The first portion 221 of the electron transit region 220 corresponds to the portion of the electron supply region 22 which is in contact with the gate electrode layer 30 and the portion of the electron supply region 22 which extends from the gate electrode layer 30 toward the drain electrode 33 and is composed of i-InAs. The second portion 222 of the electron transit region 220 corresponds to the portion of the electron supply region 22 which extends from the gate electrode layer 30 toward the source electrode 32 and is composed of n-InAs. Since the second portion 222 of the electron transit region 220 is an n-InAs semiconductor nanowire, the amount of electrons present in the second portion 222, which serve as carrier particles, is increased and, consequently, the high-frequency characteristic of the semiconductor device may be enhanced.

In this embodiment, the diameter of the electron transit region 220, which is a semiconductor nanowire, may be 20 to 200 nm and is, for example, about 100 nm.

Method for Manufacturing Semiconductor Device

A method for manufacturing the semiconductor device according to this embodiment is described below with reference to FIGS. 20A to 25B.

Figure 20A:
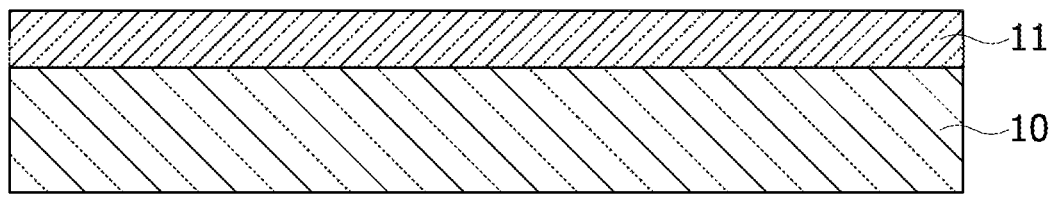
FIGS. 20A and 20B are diagrams illustrating a step of a method for manufacturing a semiconductor device according to a third embodiment (1)
Figure 20B:
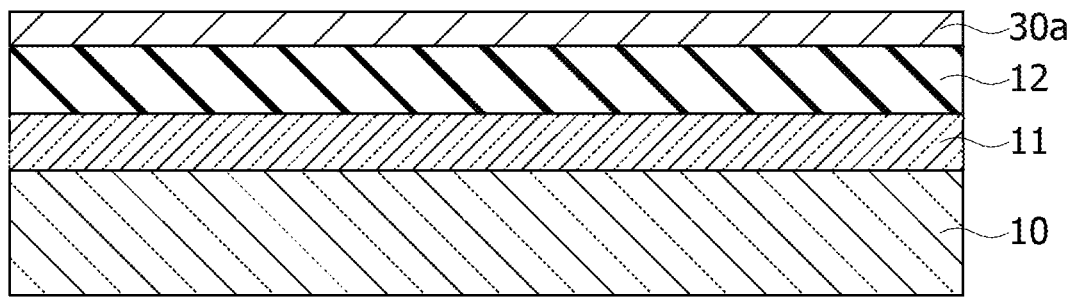
Figure 21A:
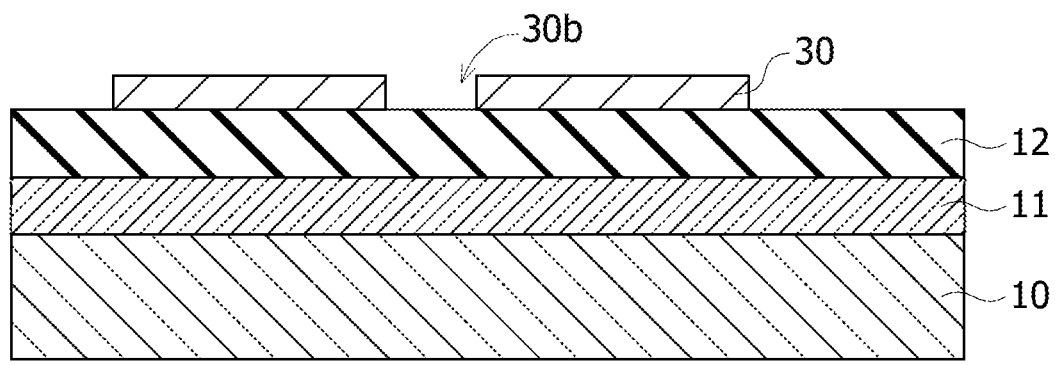
FIGS. 21A and 21B are diagrams illustrating a step of a method for manufacturing a semiconductor device according to a third embodiment (2)

First, as illustrated in FIG. 20A, a conductive semiconductor layer 11 is epitaxially grown on a semiconductor substrate 10 by MOCVD. An insulating film 12 and a metal film 30a are successively formed on the conductive semiconductor layer 11 as illustrated in FIG. 20B. The metal film 30a is formed into a gate electrode layer 30 having an opening 30b as illustrated in FIG. 21A.

Figure 21B:
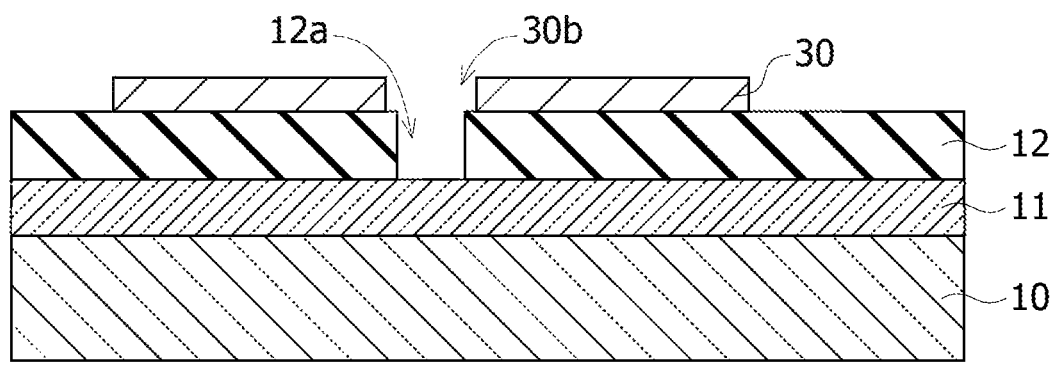
Figure 22A:
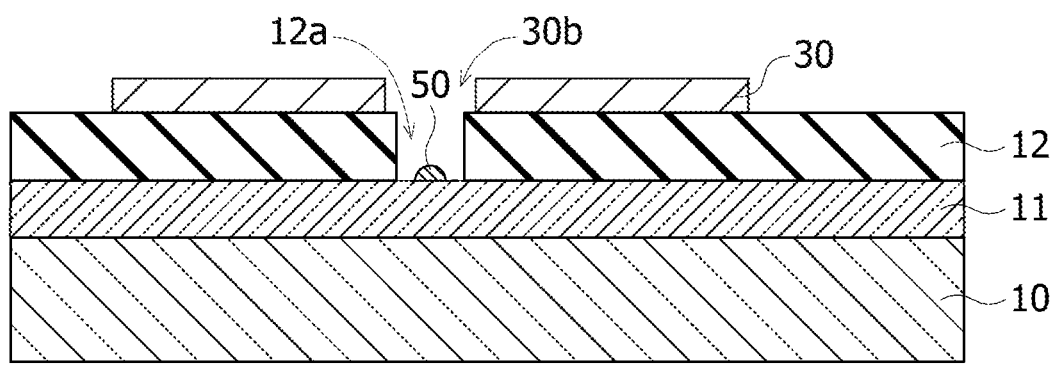
FIGS. 22A and 22B are diagrams illustrating a step of a method for manufacturing a semiconductor device according to a third embodiment (3)

At the position of the opening 30b of the gate electrode layer 30, an opening 12a is formed in the insulating film 12 as illustrated in FIG. 21B. A catalyst layer 50 is formed on a portion of the conductive semiconductor layer 11 which is exposed through the opening 12a of the insulating film 12 as illustrated in FIG. 22A.

Figure 22B:
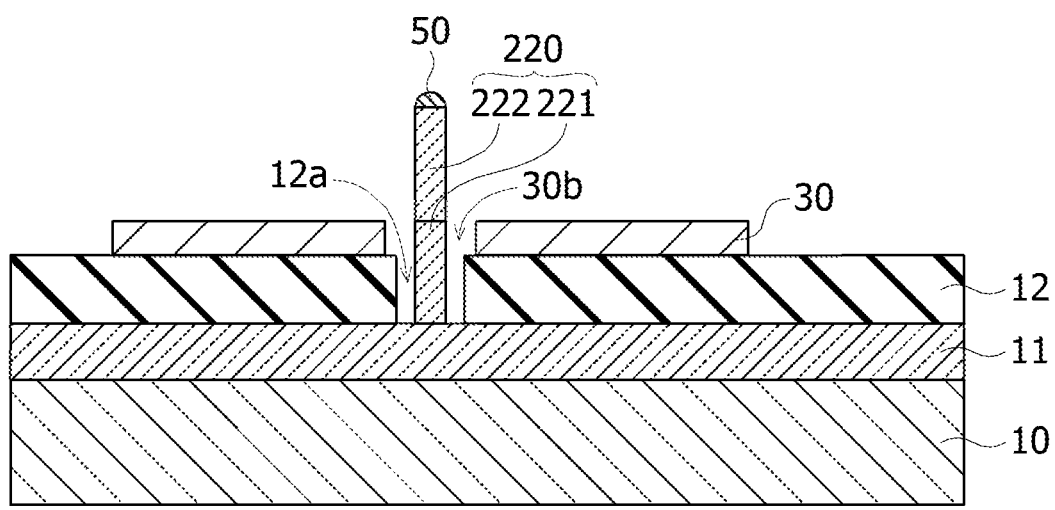

A semiconductor nanowire which serves as an electron transit region 220 is grown on the conductive semiconductor layer 11 by MOCVD or the like in a direction substantially perpendicular to the surface of the semiconductor substrate 10 as illustrated in FIG. 22B. The temperature at which the semiconductor nanowire, which serves as an electron transit region 220, is grown is about 450° C. A semiconductor nanowire having a length of 1 μm is formed by a VLS method. In the formation of the electron transit region 220, a semiconductor nanowire that serves as a first portion 221 of the electron transit region 220 is formed using i-InAs and, subsequently, a semiconductor nanowire that serves as a second portion 222 of the electron transit region 220 is formed using n-InAs. In the formation of the semiconductor nanowire that serves as an electron transit region 220, for example, TMIn and $AsH_3$ may be used as raw materials. In the formation of the second portion 222, $SiH_4$ is fed in order to dope the semiconductor with Si and produce an n-type semiconductor. In the formation of the first portion 221, an i-type semiconductor is produced since $SiH_4$ is not fed.

Figure 23A:
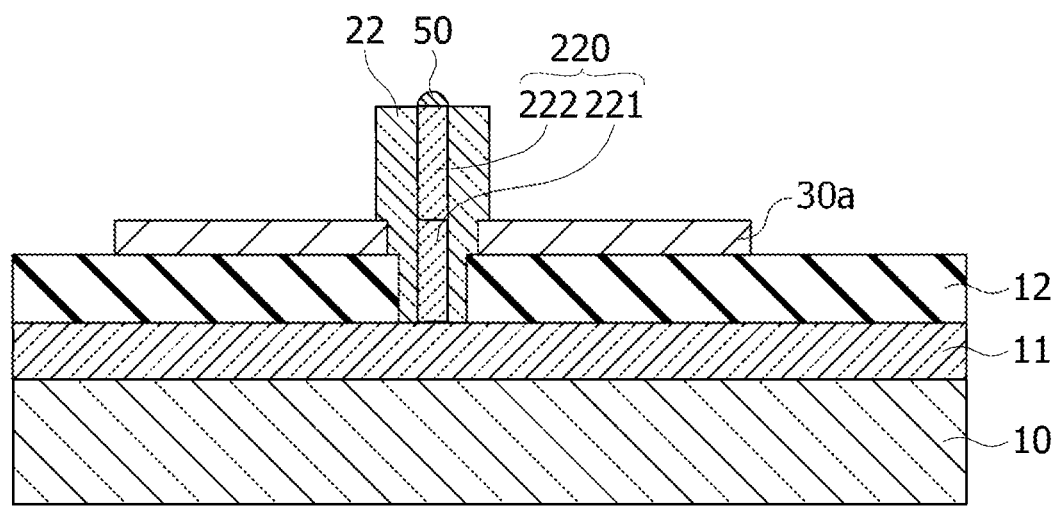
FIGS. 23A and 23B are diagrams illustrating a step of a method for manufacturing a semiconductor device according to a third embodiment (4)

An electron supply region 22 is formed on the periphery of the electron transit region 220 as illustrated in FIG. 23A. Specifically, after the growth temperature has been reduced to about 380° C., a crystal of n-InAlAs is grown on the periphery of the side surface of the semiconductor nanowire which serves as an electron transit region 220 to form an electron supply region 22.

The electron supply region 22 fills the gap between the semiconductor nanowire which serves as an electron transit region 220 and the insulating film 12 to form the portion that extends from the lower edge of the gate electrode layer 30 toward the drain electrode 33. The electron supply region 22 also fills the gap between the semiconductor nanowire and the gate electrode layer 30 to form the portion that is in contact with the gate electrode layer 30. The electron supply region 22 keeps growing in the region in which neither the insulating film 12 nor the gate electrode layer 30 is formed and forms the portion that extends from the upper edge of the gate electrode layer 30 toward the source electrode 32.

Figure 23B:
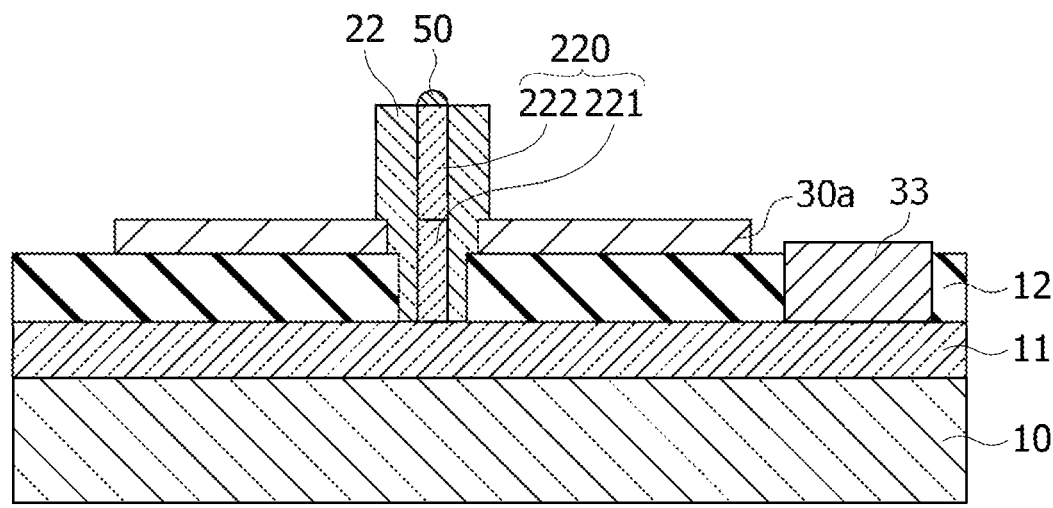
Figure 24A:
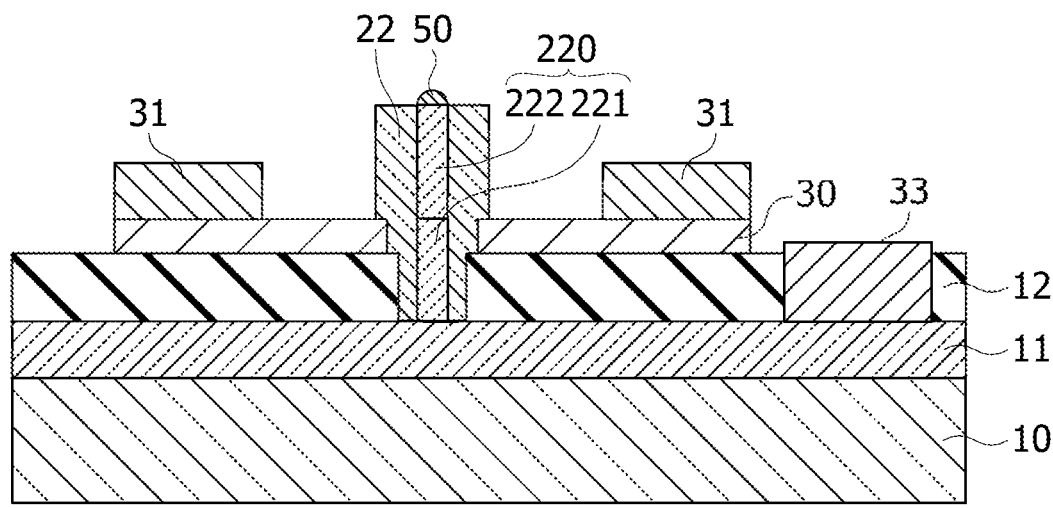
FIGS. 24A and 24B are diagrams illustrating a step of a method for manufacturing a semiconductor device according to a third embodiment (5)
Figure 24B:
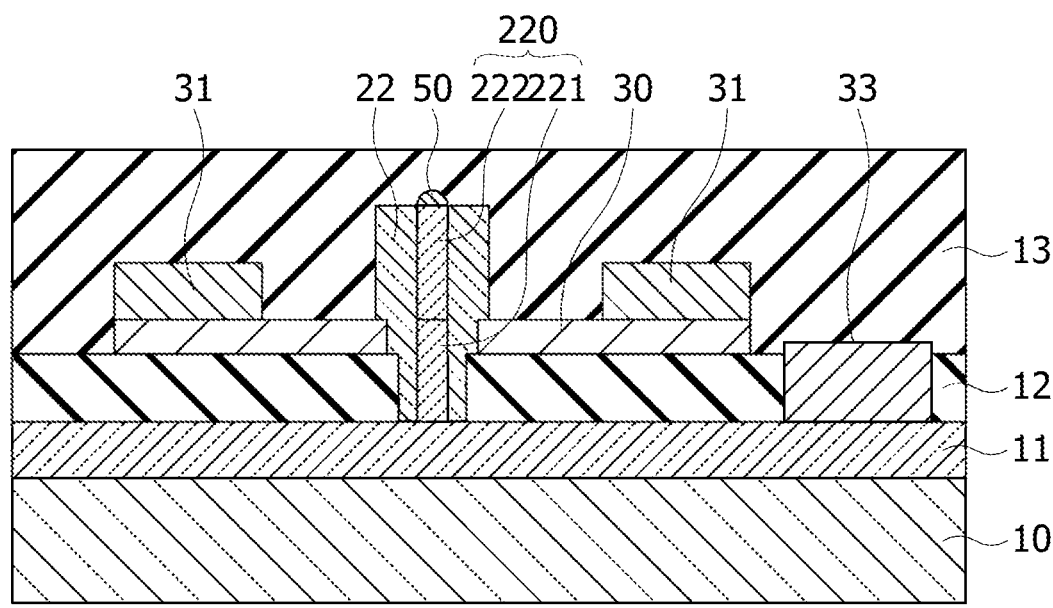

A drain electrode 33 is formed on the conductive semiconductor layer 11 as illustrated in FIG. 23B. A gate electrode 31 is formed on the gate electrode layer 30 as illustrated in FIG. 24A. An interlayer insulating film 13 that covers the insulating film 12, the gate electrode layer 30, the electron supply region 22, the catalyst layer 50, the drain electrode 33, and the gate electrode 31 is formed as illustrated in FIG. 24B.

Figure 25A:
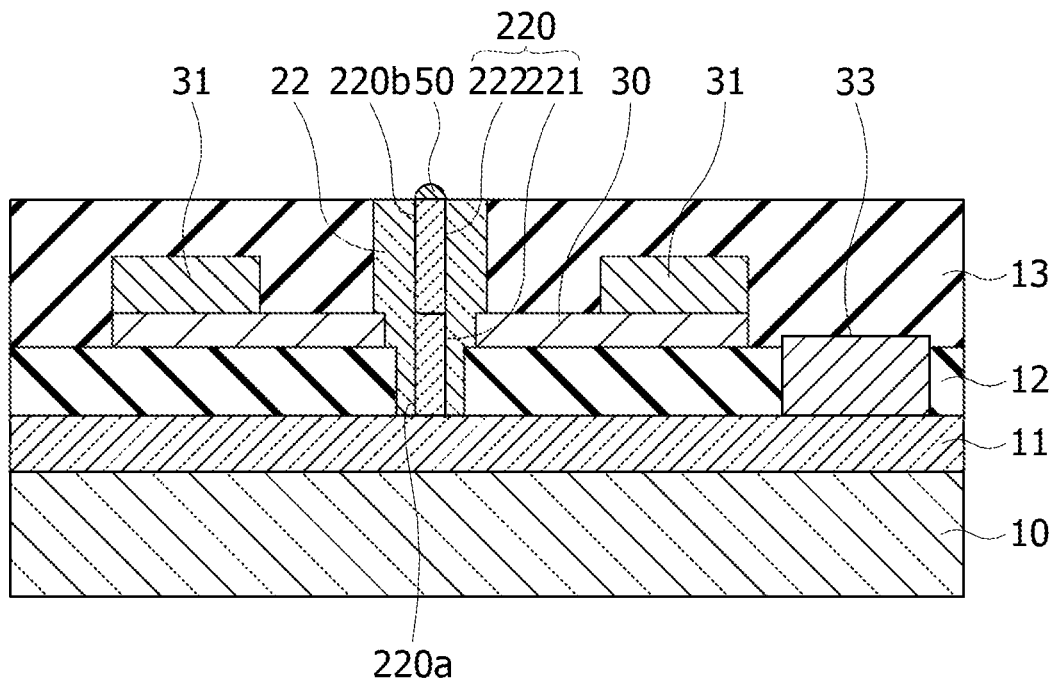
FIGS. 25A and 25B are diagrams illustrating a step of a method for manufacturing a semiconductor device according to a third embodiment (6)

The interlayer insulating film 13 is etched back such that the electron supply region 22 and the catalyst layer 50 are exposed at the surface of the interlayer insulating film 13 as illustrated in FIG. 25A.

Figure 25B:
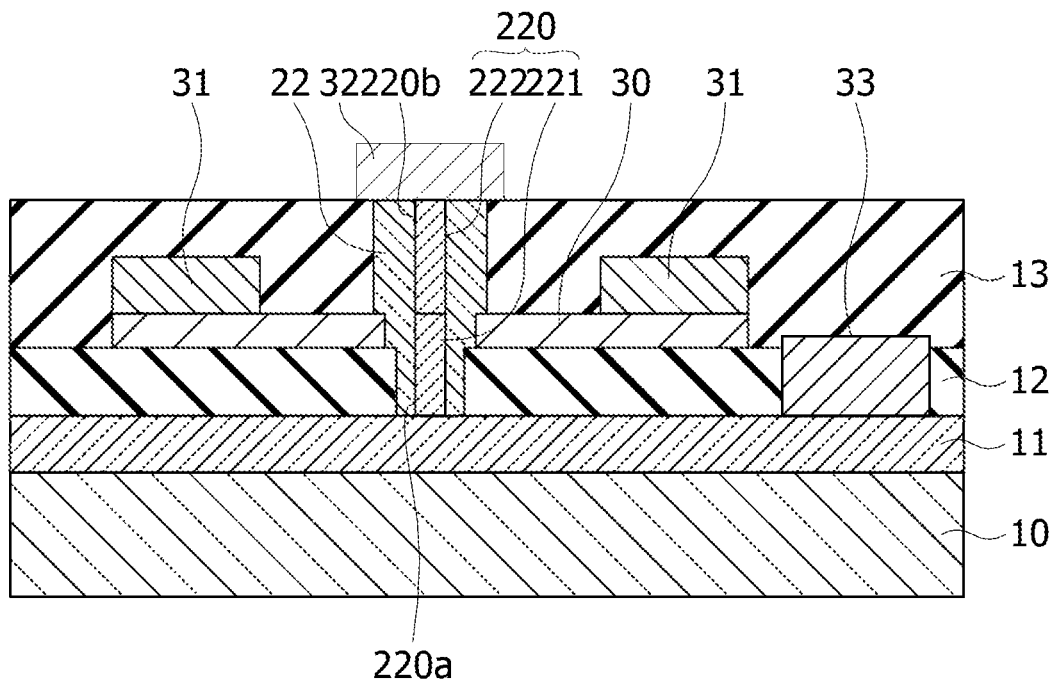

A source electrode 32 is formed on the electron transit region 220 and the electron supply region 22 as illustrated in FIG. 25B.

The semiconductor device according to this embodiment is produced by the above-described process.

Details of the production method other than described above are the same as in the first embodiment.

Fourth Embodiment

A semiconductor device according to the fourth embodiment is described below. In the semiconductor device according to this embodiment, the electron transit region is disposed on the periphery of the side surface of a semiconductor nanowire that serves as a first electron supply region, and a second electron supply region is disposed on the periphery of the side surface of the electron transit region.

Figure 26:
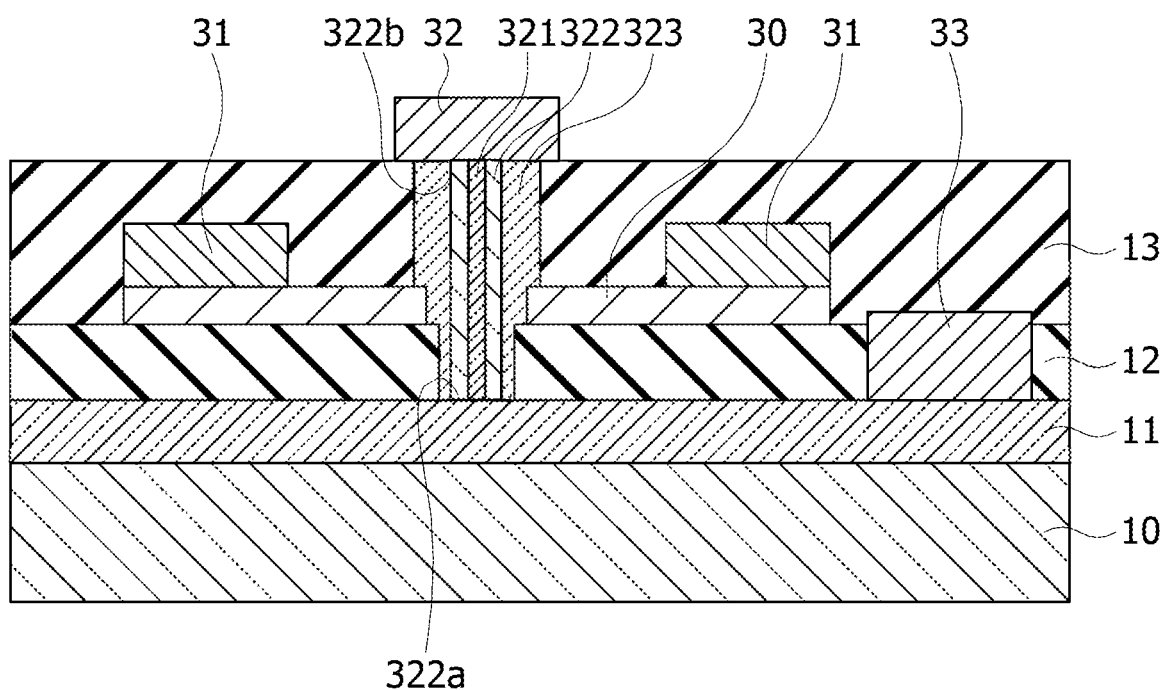
FIG. 26 is a diagram illustrating a semiconductor device according to a fourth embodiment.

Specifically, as illustrated in FIG. 26, the semiconductor device according to this embodiment includes a semiconductor substrate 10, a conductive semiconductor layer 11 disposed on the semiconductor substrate 10, a first electron supply region 321 disposed on the conductive semiconductor layer 11 which is a semiconductor nanowire that extends substantially perpendicular to the surface of the semiconductor substrate 10, an electron transit region 322 disposed on the periphery of the side surface of the first electron supply region 321, which is a semiconductor nanowire, and a second electron supply region 323 disposed on the periphery of the side surface of the electron transit region 322.

On a portion of the surface of the conductive semiconductor layer 11 which is other than the portion of the surface of the conductive semiconductor layer 11 on which the first electron supply region 321, the electron transit region 322, and the second electron supply region 323 are disposed, an insulating film 12, a gate electrode layer 30, an interlayer insulating film 13, and the like are stacked on top of one another. An end 322a of the electron transit region 322 which faces the drain electrode 33 is electrically connected to the conductive semiconductor layer 11, while the other end 322b is electrically connected to the source electrode 32.

In the semiconductor device according to this embodiment, the first electron supply region 321 is an n-InAlAs semiconductor nanowire, the electron transit region 322 disposed on the periphery of the side surface of the first electron supply region 321 is composed of i-InAs, and the second electron supply region 323 disposed on the periphery of the side surface of the electron transit region 322 is composed of n-InAlAs. Consequently, an electron gas is generated in the portion of the electron transit region 322 which is in the vicinity of the interface between the first electron supply region 321 and the electron transit region 322 and the portion of the electron transit region 322 which is in the vicinity of the interface between the electron transit region 322 and the second electron supply region 323. Therefore, in the semiconductor device according to this embodiment, the amount of carrier particles present in the electron transit region 322 is increased. This enables the semiconductor device to operate at a high speed and have a suitable high-frequency characteristic.

In this embodiment, the diameter of the first electron supply region 321, which is a semiconductor nanowire, may be 20 to 200 nm and is, for example, about 100 nm, the thickness of the electron transit region 322 is 5 to 20 nm, and the thickness of the second electron supply region 323 is 5 to 30 nm. In this embodiment, n-InAlAs constituting the first electron supply region 321 and the second electron supply region 323 is doped with an impurity element that is $1 \times 10^{18}$ to $2 \times 10^{19}$ $cm^{-3}$ Si. Hereinafter, the first electron supply region 321 is referred to as "first semiconductor region", the electron transit region 322 is referred to as "second semiconductor region", and the second electron supply region 323 is referred to as "third semiconductor region".

Method for Manufacturing Semiconductor Device

A method for manufacturing the semiconductor device according to this embodiment is described below with reference to FIGS. 27A to 33.

Figure 27A:
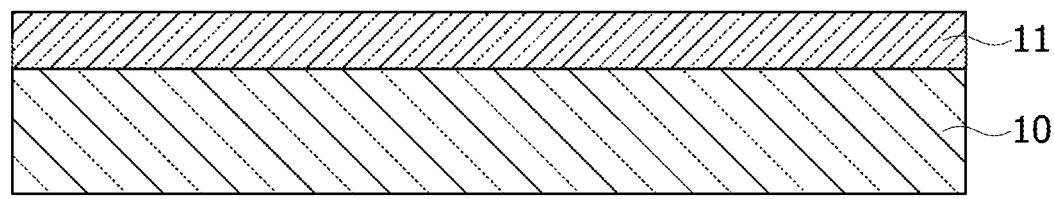
FIGS. 27A and 27B are diagrams illustrating a step of a method for manufacturing a semiconductor device according to a fourth embodiment (1)

First, as illustrated in FIG. 27A, a conductive semiconductor layer 11 is epitaxially grown on a semiconductor substrate 10 by MOCVD.

Figure 27B:
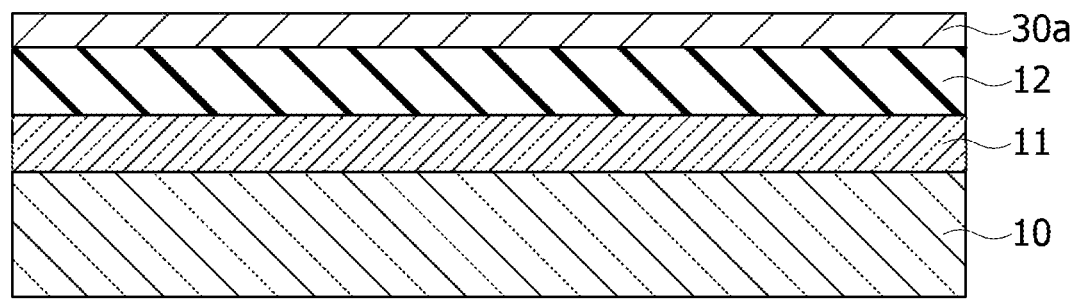
Figure 28A:
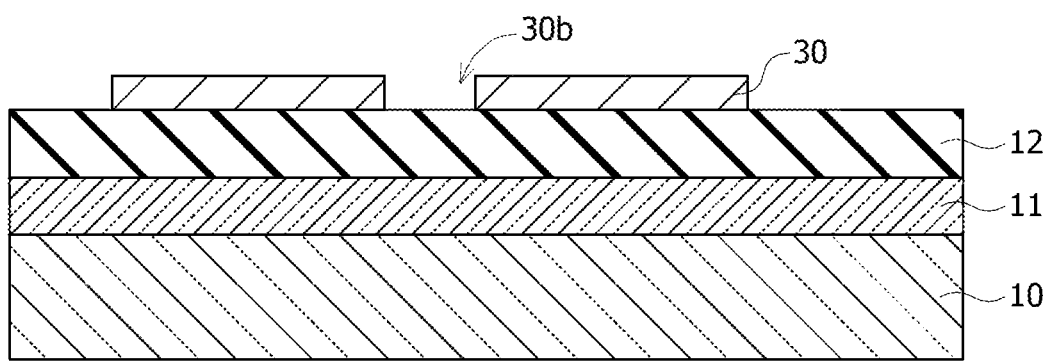
FIGS. 28A and 28B are diagrams illustrating a step of a method for manufacturing a semiconductor device according to a fourth embodiment (2)
Figure 28B:
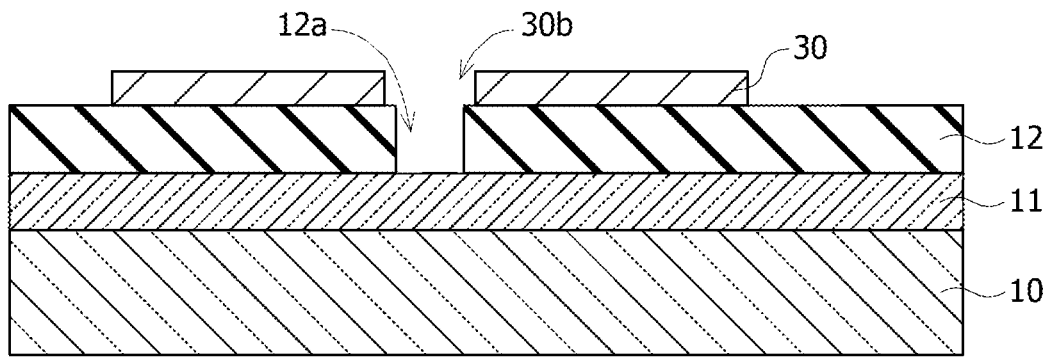

An insulating film 12 and a metal film 30a are successively formed on the conductive semiconductor layer 11 as illustrated in FIG. 27B. The metal film 30a is formed into a gate electrode layer 30 having an opening 30b as illustrated in FIG. 28A. At the position of the opening 30b of the gate electrode layer 30, an opening 12a is formed in the insulating film 12 as illustrated in FIG. 28B.

Figure 29A:
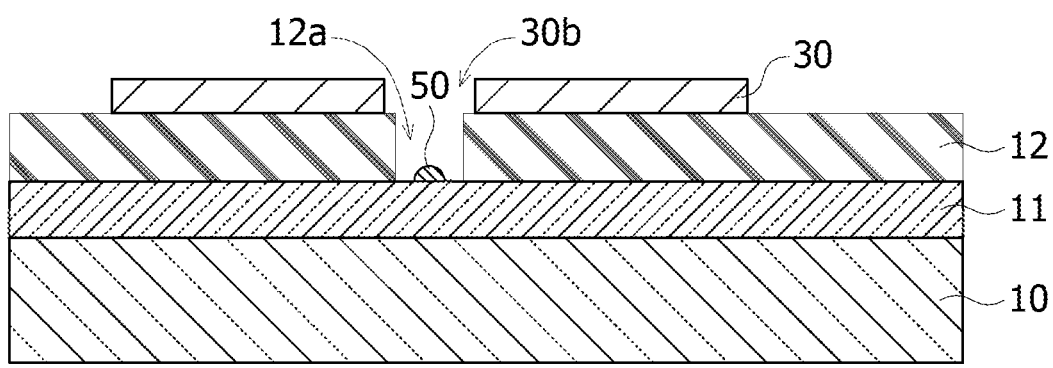
FIGS. 29A and 29B are diagrams illustrating a step of a method for manufacturing a semiconductor device according to a fourth embodiment (3)

A catalyst layer 50 is formed on a portion of the surface of the conductive semiconductor layer 11 which is exposed through the opening 12a of the insulating film 12 as illustrated in FIG. 29A.

Figure 29B:
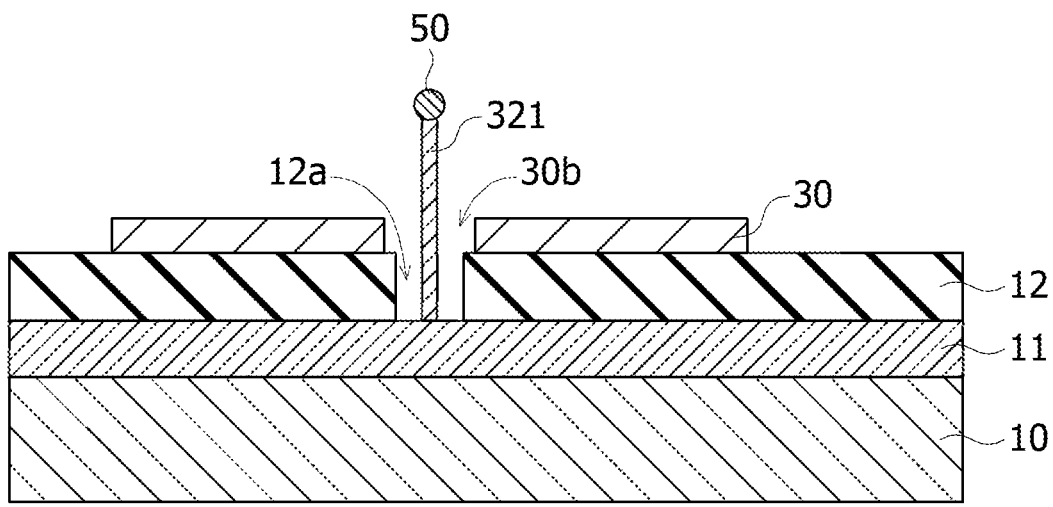

A semiconductor nanowire which is composed of n-InAlAs and serves as a first electron supply region 321 is grown on the conductive semiconductor layer 11 by MOCVD or the like in a direction substantially perpendicular to the surface of the semiconductor substrate 10 as illustrated in FIG. 29B. The temperature at which the semiconductor nanowire, which serves as a first electron supply region 321, is grown is about 450° C. A semiconductor nanowire having a length of 1 µm is formed by a VLS method. In the formation of the n-InAlAs semiconductor nanowire that serves as a first electron supply region 321, for example, TMIn, TMAl, and $AsH_3$ may be used as raw materials. Furthermore, $SiH_4$ may be used for doping the semiconductor material with an impurity element.

Figure 30A:
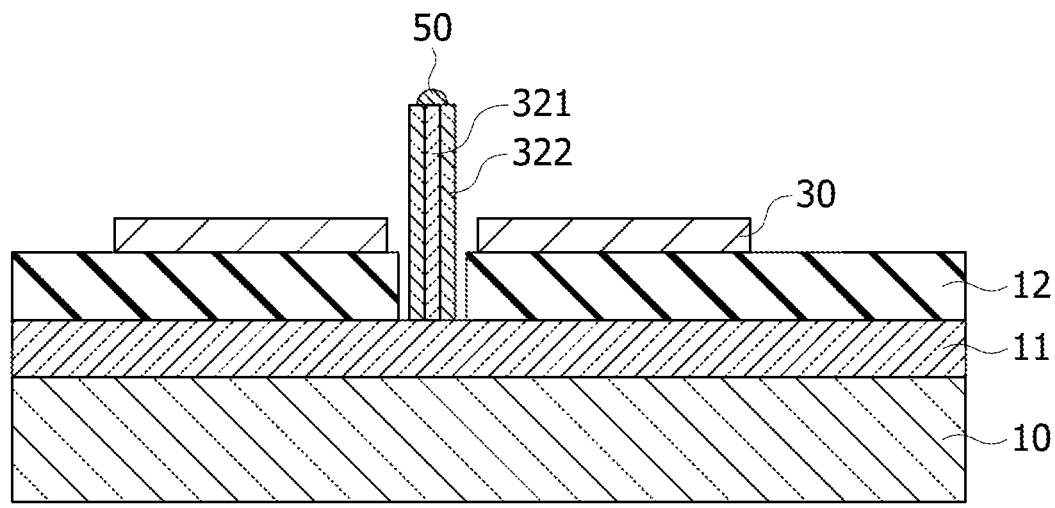
FIGS. 30A and 30B are diagrams illustrating a step of a method for manufacturing a semiconductor device according to a fourth embodiment (4)

An electron transit region 322 is formed on the periphery of the first electron supply region 321 as illustrated in FIG. 30A. Specifically, after the growth temperature has been reduced to about 380° C., a crystal of i-InAs is grown on the periphery of the side surface of the semiconductor nanowire that serves as a first electron supply region 321 to form an electron transit region 322. The semiconductor nanowire that serves as an electron transit region 322 may be a semiconductor nanowire composed of i-InGaAs.

Figure 30B:
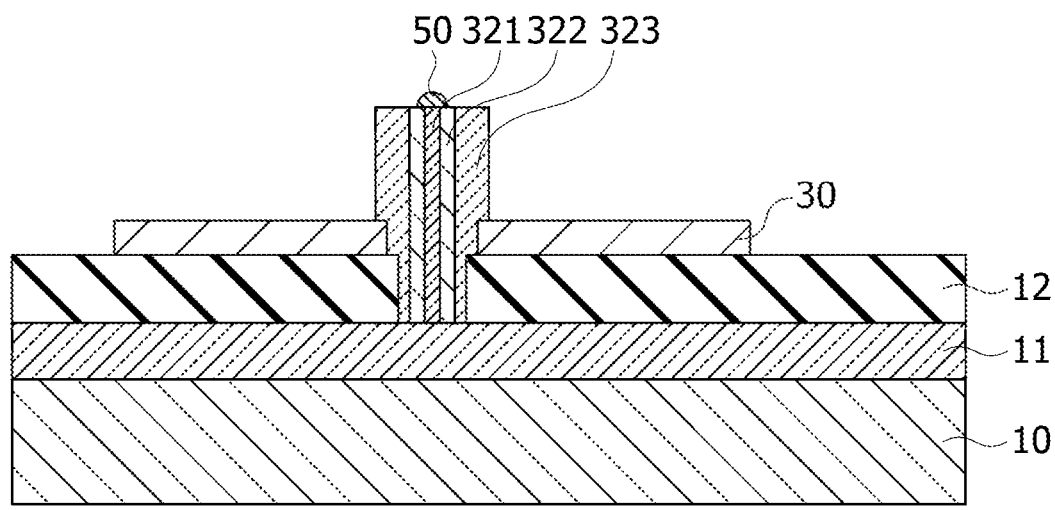

A second electron supply region 323 is formed on the periphery of the electron transit region 322 as illustrated in FIG. 30B. Specifically, while the growth temperature is maintained to be about 380° C., a crystal of n-InAlAs is grown on the periphery of the side surface of the electron transit region 322 to form a second electron supply region 323.

The second electron supply region 323 fills the gap between the electron transit region 322 and the insulating film 12 and the gap between the electron transit region 322 and the gate electrode layer 30 and keeps growing in the region in which neither the insulating film 12 nor the gate electrode layer 30 is formed. As a result, the thickness of the portion of the second electron supply region 323 which is in contact with the gate electrode layer 30, which is determined by the gate electrode layer 30, becomes larger than the thickness of the portion that extends from the gate electrode layer 30 toward the drain electrode 33, which is determined by the insulating film 12. Furthermore, the thickness of the portion of the second electron supply region 323 which extends from the gate electrode layer 30 toward the source electrode 32, which is determined by no component, becomes larger than the thickness of the portion that is in contact with the gate electrode layer 30, which is determined by the gate electrode layer 30.

Figure 31A:
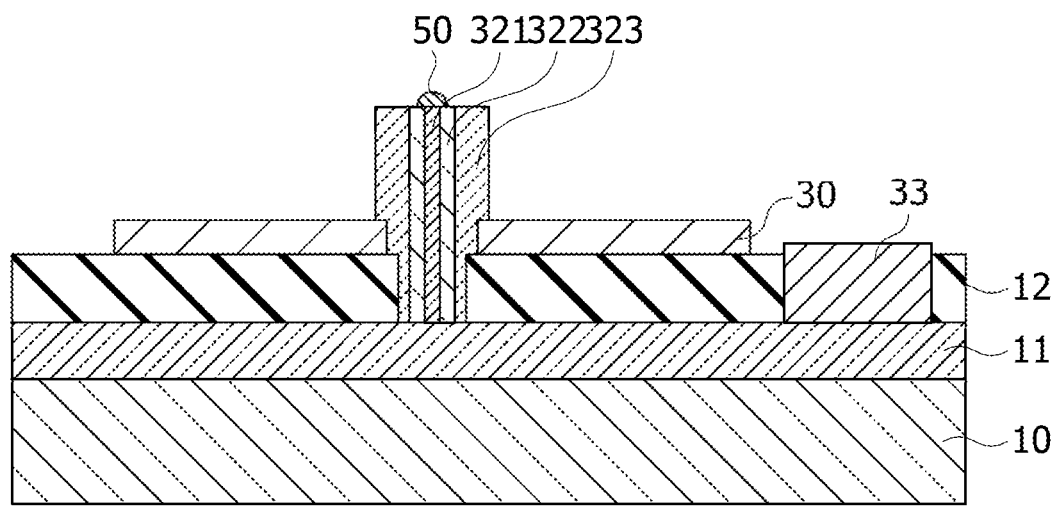
FIGS. 31A and 31B are diagrams illustrating a step of a method for manufacturing a semiconductor device according to a fourth embodiment (5)
Figure 31B:
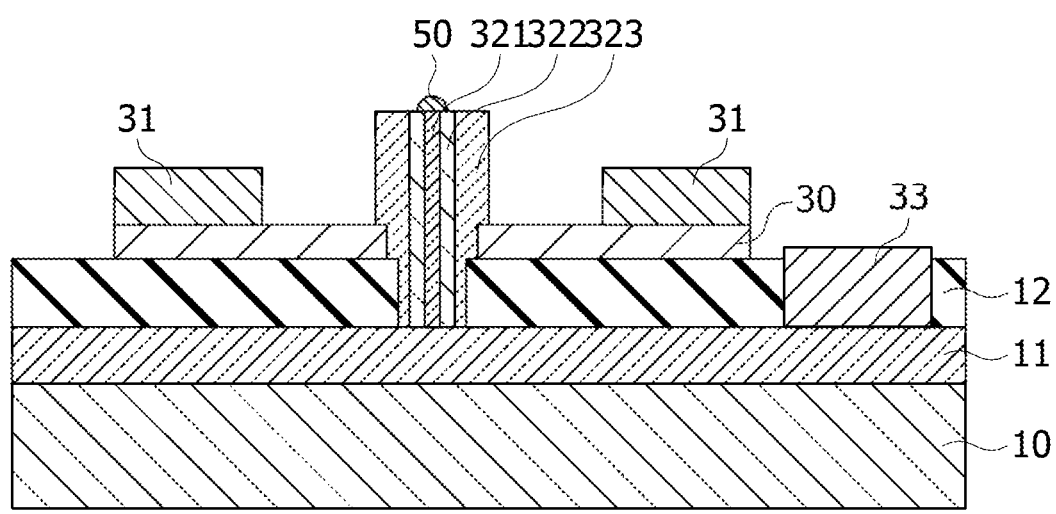
Figure 32A:
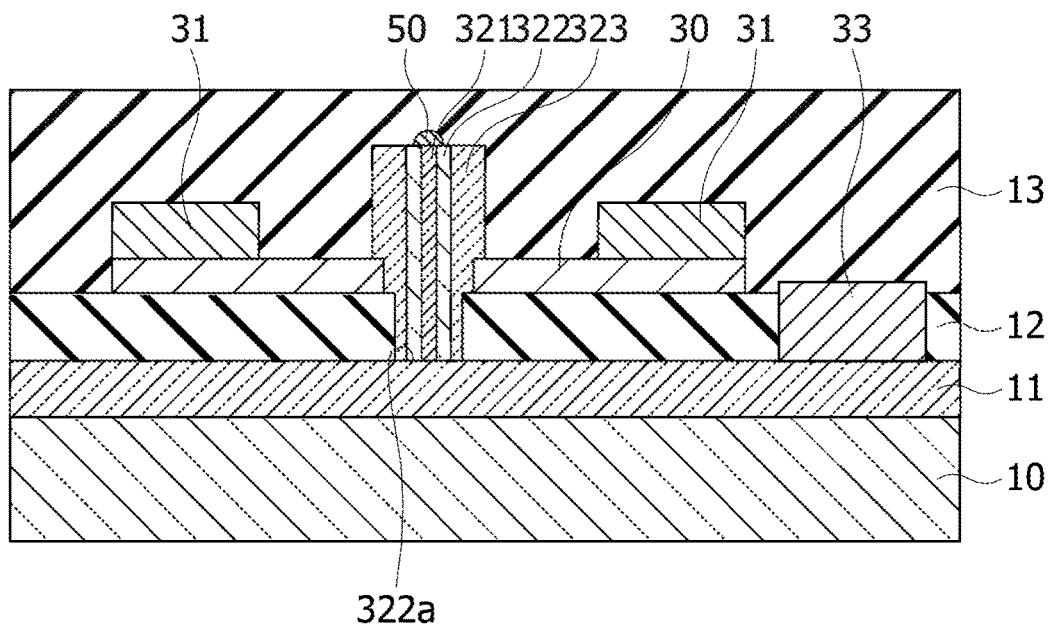
FIGS. 32A and 32B are diagrams illustrating a step of a method for manufacturing a semiconductor device according to a fourth embodiment (6)

A drain electrode 33 is formed on the conductive semiconductor layer 11 as illustrated in FIG. 31A. A gate electrode 31 is formed on the gate electrode layer 30 as illustrated in FIG. 31B. An interlayer insulating film 13 that covers the insulating film 12, the gate electrode layer 30, the electron transit region 322, the second electron supply region 323, the catalyst layer 50, the drain electrode 33, and the gate electrode 31 is formed as illustrated in FIG. 32A.

Figure 32B:
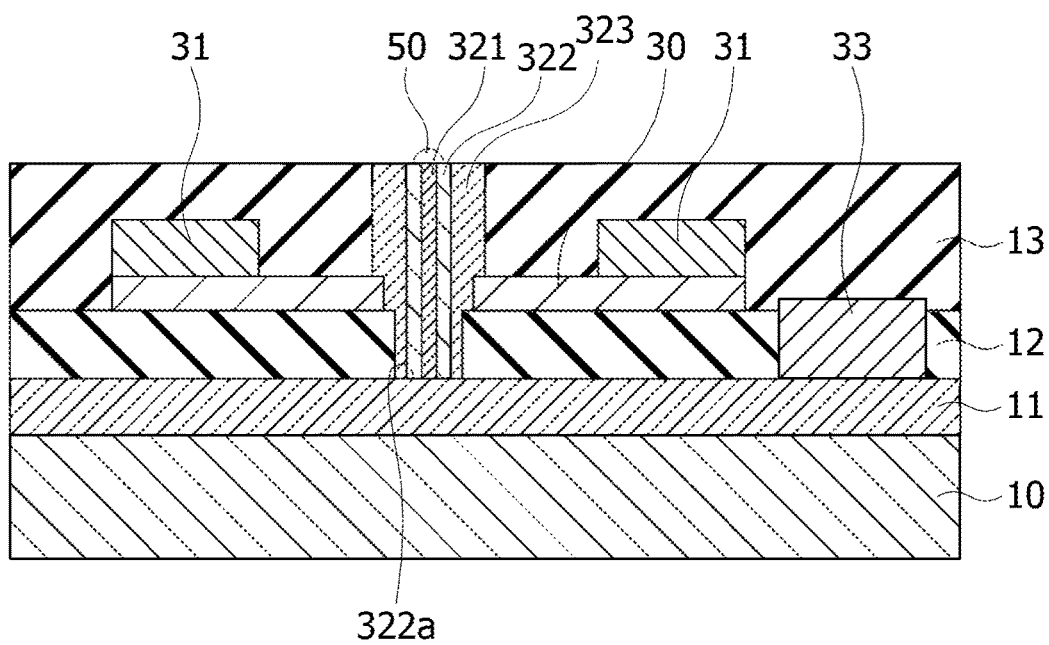

The interlayer insulating film 13 is etched back such that the electron transit region 322, the second electron supply region 323, and the catalyst layer 50 are exposed at the surface of the interlayer insulating film 13 as illustrated in FIG. 32B.

Figure 33:
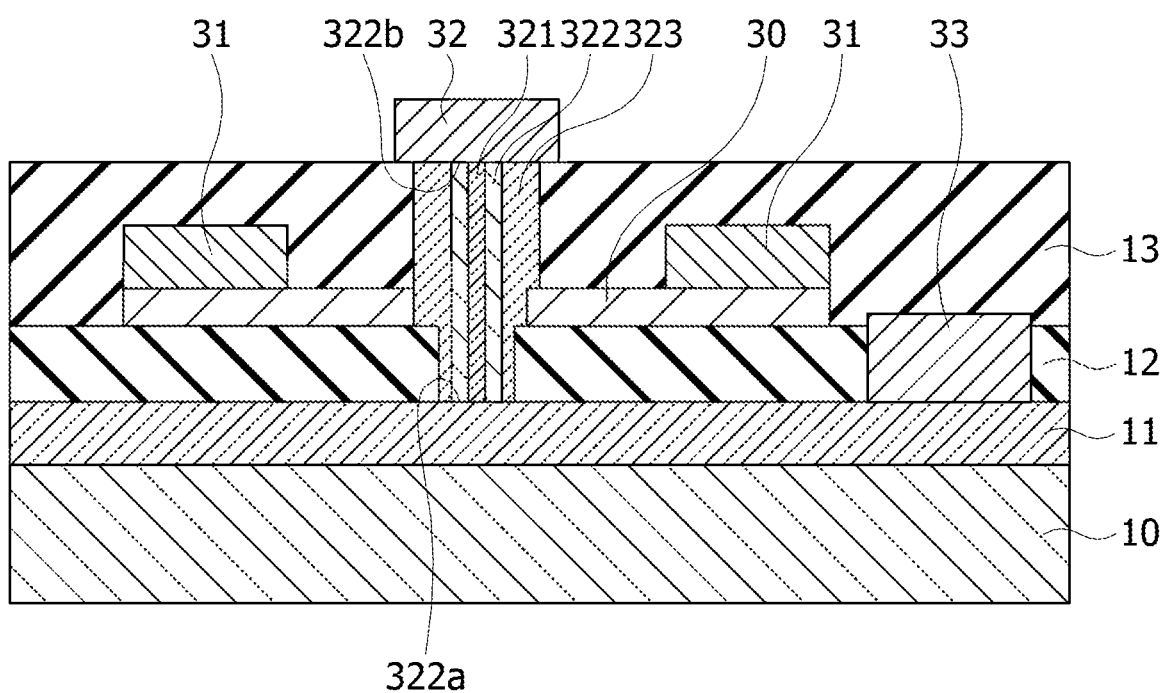
FIG. 33 is a diagram illustrating a step of a method for manufacturing a semiconductor device according to a fourth embodiment (7)

A source electrode 32 is formed on the first electron supply region 321, the electron transit region 322, and the second electron supply region 323 as illustrated in FIG. 33.

The semiconductor device according to this embodiment is produced by the above-described process.

Details of the production method other than described above are the same as in the first embodiment.

Fifth Embodiment

The fifth embodiment is described below. A radio receiver according to the fifth embodiment includes the semiconductor device according to any one of the first to fourth embodiments.

Figure 34:
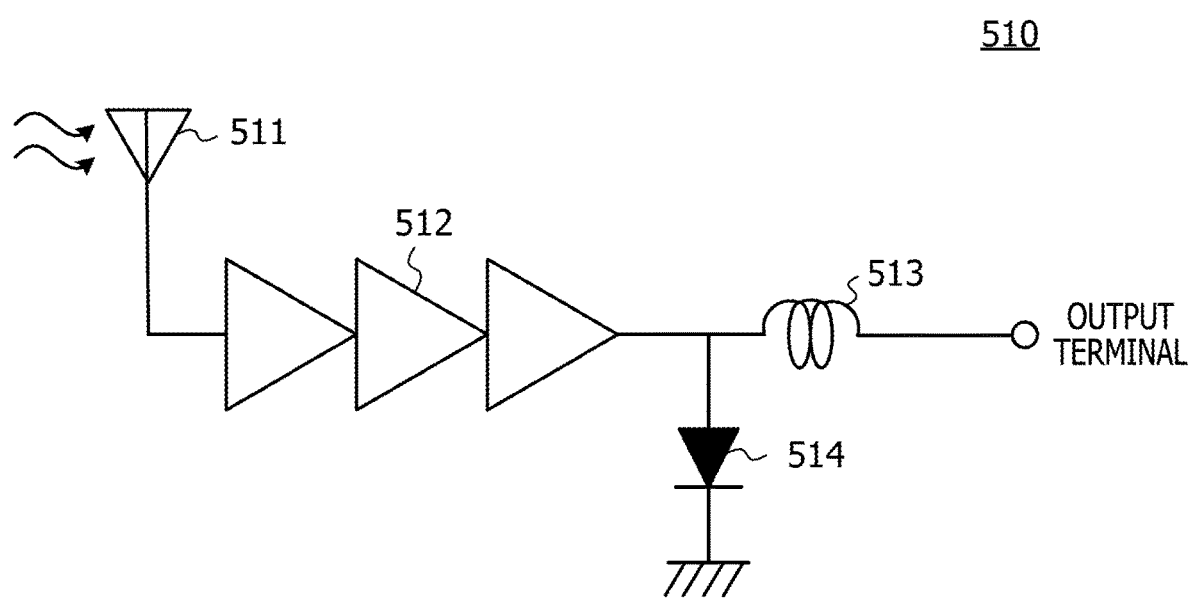
FIG. 34 is a diagram for explaining a radio receiver according to a fifth embodiment.

As illustrated in FIG. 34, a radio receiver 510 according to this embodiment includes a receiving antenna 511, a low-noise amplifier 512, an inductor 513, a diode 514, and an output terminal. The low-noise amplifier 512 is the semiconductor device according to any one of the first to fourth embodiments.

In the radio receiver 510, the receiving antenna 511 is connected to the input of the low-noise amplifier 512. The output of the low-noise amplifier 512 is connected to the anode of the diode 514 and one of the terminals of the inductor 513. The cathode of the diode 514 is grounded. The other terminal of the inductor 513 is connected to the output terminal of the radio receiver 510.

The radio wave received by the receiving antenna 511 is amplified with the low-noise amplifier 512 and subsequently half-wave rectified by the diode 514. After impedance matching has been performed by the inductor 513, the resulting radio wave is output from the output terminal.

Since the low-noise amplifier 512 that is the semiconductor device according to any one of the first to fourth embodiments has a suitable high-frequency characteristic, the low-noise amplifier 512 is capable of amplifying the radio wave received by the receiving antenna 511 at a predetermined level even when the frequency of the radio wave is high.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device comprising:
   a semiconductor substrate composed of a compound semiconductor;
   a first semiconductor region disposed over a surface of the semiconductor substrate so as to extend in a first direction which is upward from the surface of the semiconductor substrate, the first semiconductor region including a semiconductor nanowire composed of a compound semiconductor;

a second semiconductor region disposed over the periphery of a side surface of the first semiconductor region;

a gate electrode disposed over the periphery of the second semiconductor region so as to extend in a second direction which is perpendicular to the first direction and is in contact with the second semiconductor region;

a drain electrode coupled to one end of the first semiconductor region; and a source electrode disposed in the first direction from the surface of the semiconductor substrate so as to be coupled to another end of the first semiconductor region, the first and second semiconductor regions being composed of different semiconductor materials.

2. The semiconductor device according to claim 1, wherein a first portion of the second semiconductor region has a larger outside diameter than a second portion of the second semiconductor region, the second portion being in contact with the gate electrode, the first portion extending from the second portion toward the source electrode.

3. The semiconductor device according to claim 1, wherein a second portion of the second semiconductor region, the second portion being in contact with the gate electrode, has a larger outside diameter than a third portion of the second semiconductor region, the third portion extending from the second portion toward the drain electrode.

4. The semiconductor device according to claim 1, wherein the first semiconductor region includes first and second portions, the first portion including the one end, the second portion including the other end, wherein the first and second portions are in contact with each other, and wherein the first and second portions are composed of different semiconductor materials.

5. The semiconductor device according to claim 4, wherein the semiconductor material constituting the first portion has a narrower bandgap than the semiconductor material constituting the second portion.

6. The semiconductor device according to claim 1, wherein the first semiconductor region includes first and second portions, the first portion including the one end, the second portion including the other end, wherein the first and second portions are in contact with each other, and wherein the second portion includes a larger amount of impurity element than the first portion.

7. The semiconductor device according to claim 1, wherein the first semiconductor region is composed of any of InAs, InGaAs, InSb, and InGaSb, and wherein the second semiconductor region is composed of a material including InAlAs.

8. The semiconductor device according to claim 1, wherein the second semiconductor region is n-type.

9. The semiconductor device according to claim 1, wherein an electron gas is generated in a portion of the first semiconductor region which is in the vicinity of the interface between the first semiconductor region and the second semiconductor region.

10. The semiconductor device according to claim 1, wherein a conductive semiconductor layer composed of a compound semiconductor including an impurity element is disposed over the semiconductor substrate, wherein the first semiconductor region is disposed over the conductive semiconductor layer, and wherein the drain electrode is disposed over the conductive semiconductor layer.

11. A semiconductor device comprising:

a semiconductor substrate composed of a compound semiconductor;

a first semiconductor region disposed over a surface of the semiconductor substrate so as to extend in a first direction which is upward from the surface of the semiconductor substrate, the first semiconductor region including a semiconductor nanowire composed of a compound semiconductor;

a second semiconductor region disposed over the periphery of a side surface of the first semiconductor region;

a third semiconductor region disposed over the periphery of a side surface of the second semiconductor region;

a gate electrode disposed over the periphery of the third semiconductor region so as to extend in a second direction which is perpendicular to the first direction and is in contact with the second semiconductor region;

a drain electrode coupled to one end of the second semiconductor region; and a source electrode disposed in the first direction from the surface of the semiconductor substrate so as to be coupled to another end of the second semiconductor region and extend in the second direction, the first and third semiconductor regions being composed of the same semiconductor material, the second semiconductor region being composed of a semiconductor material different from the semiconductor material of which the first and third semiconductor regions are composed.

12. The semiconductor device according to claim 11, wherein the second semiconductor region is composed of any of InAs, InGaAs, InSb, and InGaSb, and wherein the first and third semiconductor regions are composed of a material including InAlAs.

13. The semiconductor device according to claim 11, wherein the first and third semiconductor regions are n-type.

14. The semiconductor device according to claim 11, wherein an electron gas is generated in a portion of the second semiconductor region which is in the vicinity of the interface between the first semiconductor region and the second semiconductor region and a portion of the second semiconductor region which is in the vicinity of the interface between the third semiconductor region and the second semiconductor region.

* * * * *